(12) United States Patent
Kageyama et al.

(10) Patent No.: US 9,082,769 B2
(45) Date of Patent: Jul. 14, 2015

(54) SEMICONDUCTOR DEVICE AND FABRICATION METHOD THEREOF

(75) Inventors: Satoshi Kageyama, Kyoto (JP); Yuichi Nakao, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 111 days.

(21) Appl. No.: 13/367,964

(22) Filed: Feb. 7, 2012

(65) Prior Publication Data

US 2012/0199942 A1 Aug. 9, 2012

(30) Foreign Application Priority Data

Feb. 7, 2011 (JP) .................................. 2011-24389
Feb. 7, 2011 (JP) .................................. 2011-24390

(51) Int. Cl.
*H01L 23/52* (2006.01)
*H01L 23/525* (2006.01)
*H01L 23/532* (2006.01)

(52) U.S. Cl.
CPC ....... *H01L 23/5258* (2013.01); *H01L 23/53238* (2013.01); *H01L 23/53295* (2013.01); *H01L 2924/0002* (2013.01)

(58) Field of Classification Search
USPC ................... 257/208–211, 528–530, E21.592, 257/774–776, E23.011, E23.142–E23.151, 257/E23.175, E21.575; 438/128–132, 215, 438/281, 333, 467, 601; 337/160
See application file for complete search history.

(56) References Cited

U.S. PATENT DOCUMENTS

| | | | |
|---|---|---|---|
| 6,300,232 B1 * | 10/2001 | Satoh | 438/601 |
| 2004/0017279 A1 * | 1/2004 | Kamoshima et al. | 336/200 |
| 2004/0150070 A1 * | 8/2004 | Okada et al. | 257/508 |
| 2005/0161766 A1 * | 7/2005 | Sato et al. | 257/529 |
| 2005/0179062 A1 * | 8/2005 | Kajita | 257/209 |

FOREIGN PATENT DOCUMENTS

| | | | |
|---|---|---|---|
| JP | 07-297289 A | 11/1995 | |
| JP | 2002-176055 A | 6/2002 | |
| JP | 3974039 | 6/2007 | |

* cited by examiner

*Primary Examiner* — David Vu
*Assistant Examiner* — Cuong Nguyen
(74) *Attorney, Agent, or Firm* — Rabin & Berdo, P.C.

(57) ABSTRACT

A semiconductor device includes a lower wiring layer made of a conductive material; an upper wiring layer formed in an upper layer than the lower wiring layer; and a fuse film, at least a portion of the fuse film being formed in a plug formation layer in which a plug for connecting the lower wiring layer and the upper wiring layer is formed, and made of a conductive material including a metallic material other than copper.

5 Claims, 18 Drawing Sheets

SEMICONDUCTOR DEVICE AND FABRICATION METHOD THEREOF

CROSS-REFERENCE TO RELATED APPLICATIONS

This application is based upon and claims the benefit of priority from Japanese Patent Application Nos. 2011-24389 and 2011-24390, respectively filed on Feb. 7, 2011, the entire contents of which are incorporated herein by reference.

TECHNICAL FIELD

The present disclosure relates to a semiconductor device in which a fuse is formed within a multilayer wiring structure, and a fabrication method thereof.

BACKGROUND

A semiconductor device such as a semiconductor memory, or the like, may have a fuse in a metal wiring layer. The fuse can be configured to be cut by irradiating laser light or applying a current of a threshold value or higher. The characteristics of an electronic circuit assembled in a semiconductor device may be adjusted (trimmed) or a defective portion within the semiconductor device may be separated by selectively cutting the fuse. In general, a fuse is provided in a metal wiring layer and made of the same material as that of a metal wiring.

Aluminum (Al) has been widely used as a wiring material, and recently, wiring resistance is required to be reduced, particularly in a power semiconductor device which consumes a great amount of power. Thus, a structure of a semiconductor device using copper (Cu) having higher conductivity than that of Al, as a wiring material, has been proposed. That is, a fuse made of copper may be formed in the copper wiring layer.

However, when the fuse is cut by laser light or the like, fragments of copper constituting the fuse scatter within the wiring structure. Copper is easily spread within silicon oxide, which is a material commonly used in an interlayer insulating layer, so it may reach an element region formed on the semiconductor substrate and may likely negatively affect an element operation. Further, a fuse made of copper can easily corrode at a surface that is exposed when the fuse is cut. This corrosion may reach the vicinity of the semiconductor substrate through a current path connected to the fuse.

SUMMARY

The present disclosure provides some embodiments of a semiconductor device, and fabrication method(s) thereof, including a wiring layer made of copper as a main ingredient and having at least one fuse, the semiconductor device have characteristics for preventing degradation despite the fuse being cut.

According to some embodiments, provided is a semiconductor device, including a lower wiring layer made of a conductive material including, for example, copper as a main ingredient; an upper wiring layer formed in an upper layer than the lower wiring layer; and a fuse film, at least a portion of the fuse film being formed in a plug formation layer in which a plug for connecting the lower wiring layer and the upper wiring layer is formed, and made of a conductive material including a metallic material, for example other than copper, as a main ingredient.

The semiconductor device has a multilayer wiring structure in which a lower wiring and an upper wiring, each being made of copper as a main ingredient, for example, are connected by a plug formed in the plug formation layer. In some embodiments, at least a portion of the fuse film is formed in the plug formation layer, and the fuse film is made of a conductive material including metal, other than copper, as a main ingredient. Thus, when the fuse film is cut, fragments of the copper do not scatter, so the semiconductor device is not broken down and operational characteristics thereof are not degraded. Further, since the fuse film is made of a metallic material other than copper, a cut portion thereof will hardly corrode. Thus, a breakdown of the semiconductor device or a degradation of operational characteristics thereof resulting from corrosion starting from the fuse film can be restrained or prevented. In this manner, the semiconductor device which has the wirings using copper as a main ingredient and has characteristics which are not degraded when cutting the fuse can be provided.

In some embodiments, the upper wiring is made of a conductive material including a metal other than copper, as a main ingredient.

The semiconductor device further includes a fuse plug formed in the plug formation layer to connect the fuse film and the upper wiring layer and made of a conductive material including a metallic material, other than copper, as a main ingredient, for example.

With this configuration, the fuse film may be electrically connected to the upper wiring layer, with a fuse plug interposed therebetween. Thus, the fuse film may be connected to an internal circuit within the semiconductor device with the upper wiring layer interposed therebetween. The fuse plug may be made of a conductive material including a metallic material other than copper as a main ingredient, for example. Thus, although the fuse plug is exposed when the fuse film is cut, corrosion does not start from the fuse plug. Accordingly, the semiconductor device may have a structure in which a breakdown or a degradation of characteristics thereof resulting from the fuse is minimized.

In some embodiments, the semiconductor device further includes a capacitor obtained by stacking a lower electrode layer, an insulating layer, and an upper electrode layer. The upper electrode layer may be configured as a metallic layer in an upper layer than the lower wiring layer, and the fuse film may include a first metal layer made of the same material as that of the upper electrode layer, the first metal layer being in a same layer as the upper electrode layer.

With this configuration, the fuse film may be formed by using the first metal layer made of the same material in the same layer as the upper electrode layer of the capacitor. That is, the fuse film may be formed through the same process as that of the upper electrode layer of the capacitor. Thus, since the fuse film can be formed through a smaller number of processes, an increase in fabrication costs can be restrained.

In the semiconductor device, the fuse film may include a second metal layer made of the same material as that of the fuse plug, and the second metal layer may be in a same layer as the fuse plug.

With this configuration, the fuse film may be formed by using the second metal layer made of the same material in the same layer as that of the fuse plug. That is, the fuse film may be formed through the same process as that of the fuse plug. Thus, since the fuse film can be formed through a smaller number of processes, an increase in fabrication costs can be restrained.

With this configuration, in some embodiments, the fuse plug and the second metal layer (the fuse film) may be integrally formed, and need not be formed separately. Thus, the manufacture of the semiconductor device may be simplified or more efficient.

In some embodiments, the fuse plug and the second metal may be separated. That is, a pair of fuse plugs may be in contact with first and second regions of the fuse film, and the second metal layer may be formed in a third region of the fuse film. In this case, the first to third regions may be separated regions, and the third region positioned between the first and second regions.

The semiconductor device may further include a sealing member (for example, made of a metallic material including copper as a main ingredient) formed to have a container-like shape to surround the fuse film when viewed from a plane of the semiconductor device.

With this configuration, in some embodiments, since the fuse film is surrounded by the sealing member having the container-like shape, and a crack is formed starting from the fuse when the fuse is cut. Spreading of the crack can be restrained to the interior of the sealing member. Accordingly, the multilayer wiring structure can be protected, whereby a breakdown or a degradation of characteristics of the semiconductor device can be restrained or prevented.

According to other embodiments, provided is a method for fabricating a semiconductor device, including: forming a lower wiring layer made of a conductive material including copper as a main ingredient, for example; forming a plug formation layer on the lower wiring layer; forming a fuse film made of a conductive film including a metal, other than copper, as a main ingredient in the plug formation layer, for example; forming an opening for an interlayer connection plug and an opening for a fuse plug in the plug formation layer; burying a conductive material including a metal, other than copper, as a main ingredient, for example, in the opening for then interlayer connection plug and the opening for the fuse plug, and coupling the fuse plug to the fuse film; and forming an upper wiring layer connected to the fuse plug and the interlayer connection plug in an upper layer than the plug formation layer.

With this method, in some embodiments, since the interlayer connection plug and the fuse plug are formed through the same process, the semiconductor device having the structure capable of restraining or preventing a breakdown or a degradation of the characteristics resulting from the fuse film can be fabricated through a smaller number of processes.

In the method, in some embodiments, the forming the fuse film comprises forming a capacitor structure including a lower electrode film, an insulating film, and an upper electrode film at an upper layer than the lower wiring layer, and simultaneously forming a first metal layer made of the same metallic material as that of the upper electrode film in a same layer as the upper electrode film.

With this method, in some embodiments, the first metal film constituting the fuse film can be simultaneously formed in the process of forming the upper electrode film of the capacitor. Accordingly, the semiconductor device can be fabricated through a smaller number of processes.

In the method, in some embodiments, an opening for forming the fuse film is simultaneously formed when forming the opening for the interlayer connection plug and the opening for the fuse plug, and the burying the conductive material comprises forming a second metal layer (a portion of the fuse film) by burying a metal having the same material as that of the interlayer connection plug in the opening for forming the fuse film such that it constitutes at least a portion of the fuse film.

With this method, in some embodiments, the second metal layer constituting the fuse film can be simultaneously formed through the process of forming the plug. Accordingly, the semiconductor device can be fabricated through a smaller number of processes.

In the method, the opening for the fuse (or fuse opening) may be formed in a region within a first metal layer formation region when viewed from the plane.

With this method, in some embodiments, etching for forming the fuse opening can be stopped at the first metal layer, whereby a film thickness of the second metal layer constituting the fuse film can be accurately controlled. When the first metal layer is not formed, if etching conditions for the opening for the plug (or plug opening) to reliably reach the lower wiring layer are determined, the fuse opening becomes deeper than the film thickness required for the fuse film. For this reason, the fuse film has a film thickness more than necessary. Thus, for example, when the fuse film is cut (fusion cutting) by laser processing, a required laser light output is increased. Accordingly, when the first metal layer is previously formed and the fuse opening is formed by the first metal layer, the film thickness of the second metal layer can be controlled to have a sufficient thickness as necessary.

According to other embodiments, provided is a semiconductor device including: a semiconductor substrate; a copper fuse; a sealing layer disposed between the semiconductor substrate and the copper fuse, the seal layer being made of a copper layer; a wiring layer formed on an upper layer than the copper fuse, the wiring layer having a first portion and a second potion which are connected to a first portion and a second portion of the copper fuse, respectively, the wiring layer being made of a metallic layer that includes a metallic material other than copper; and a copper sealing member coupled to the sealing layer and formed to have a container-like shape to surround the copper fuse.

In some embodiments, the semiconductor device further includes: an external connection layer formed in a same layer as the wiring layer. The external connection layer is made of the same material as the wiring layer.

In some embodiments, the semiconductor device further includes: a plurality of copper wiring layers, wherein the copper fuse is formed in a same layer as an uppermost layer among the plurality of copper wiring layers.

DETAILED DESCRIPTION

Reference will now be made in detail to various embodiments, examples of which are illustrated in the accompanying drawings. In the following detailed description, numerous specific details are set forth in order to provide a thorough understanding of the present subject matter. However, it will be apparent to one of ordinary skill in the art that the present subject matter may be practiced without these specific details. In other instances, well-known methods, procedures, systems, and components have not been described in detail so as not to unnecessarily obscure aspects of the various embodiments.

Figure 1:
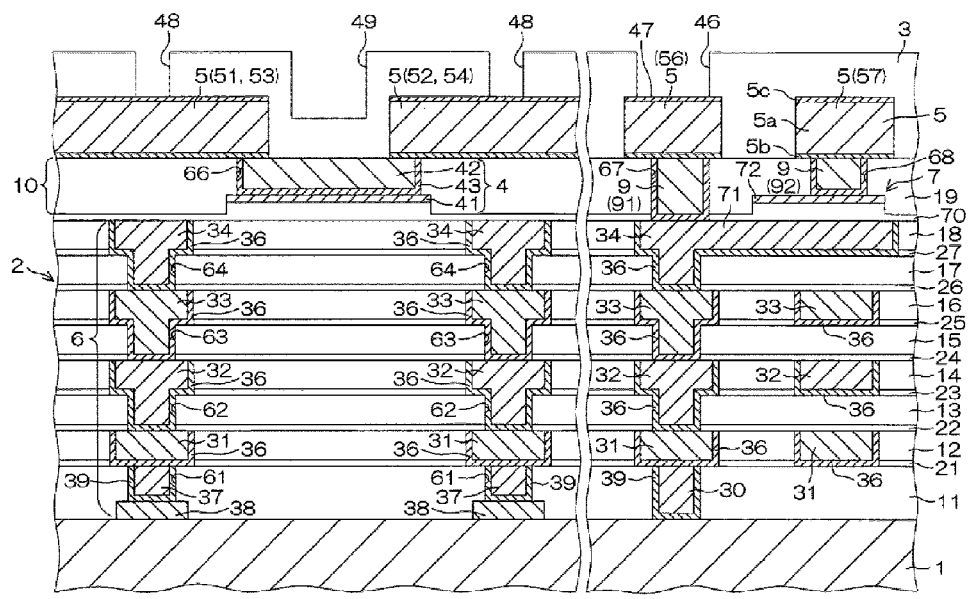
FIG. 1 is a partial sectional view of a semiconductor device, according to some embodiments.
Figure 2:
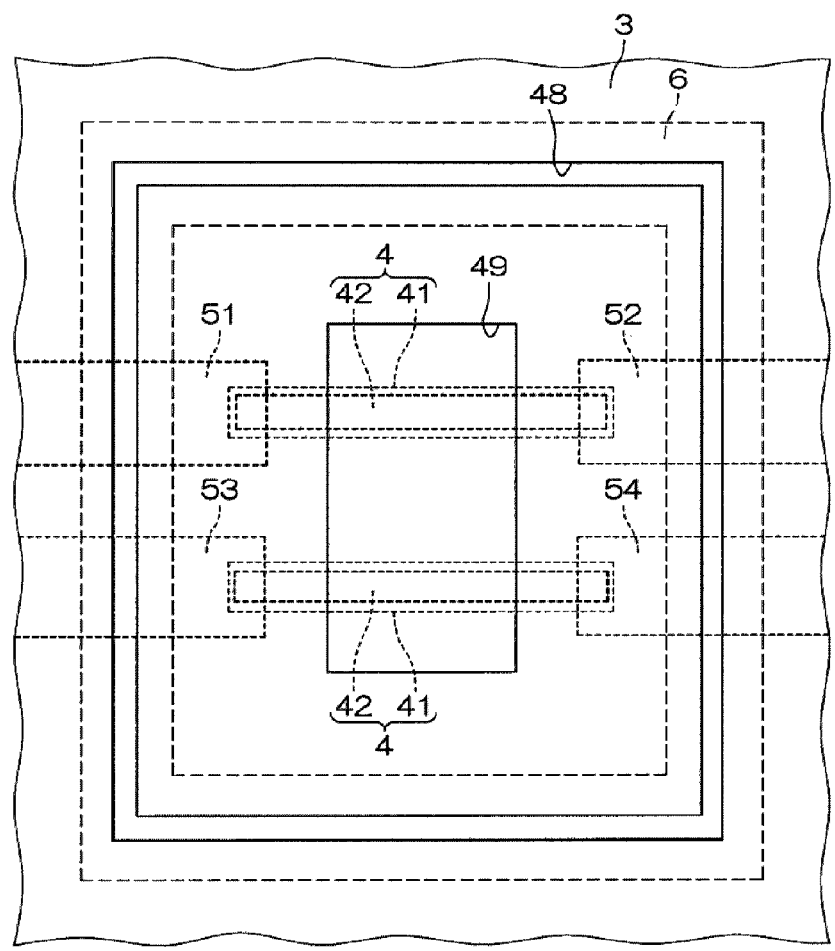
FIG. 2 is a partial plan view of the configuration illustrated in FIG. 1.

FIG. 1 is a partial sectional view of a semiconductor device, according to some embodiments, and FIG. 2 is a partial plan view of the configuration illustrated in FIG. 1. The semiconductor device includes a semiconductor substrate 1, a multilayer wiring structure 2 formed on a surface of the semiconductor substrate 1, and a passivation film (surface protective layer) 3 for covering the multilayer wiring structure 2. The semiconductor substrate 1 may be a silicon substrate. A semiconductor element (not shown) may include an active element such as a transistor or the like, and may be formed in a surface layer portion thereof. The multilayer wiring structure 2 includes first to ninth interlayer insulating layers 11 to 19, first to seventh etching stop layers 21 to 27, first to fourth metal wirings 31 to 34, a fuse film 4, and uppermost layer wirings 5. The passivation film 3 may be formed of, for example, a nitride film (silicon nitride film) and covers the surface of the uppermost layer wiring 5.

In some embodiments, the multilayer wiring structure 2 includes a sealing member 6 having a container-like shape (e.g., square container-like shape) surrounding the fuse film 4 when viewed from the plane. Further, in some embodiments, a capacitor 7 may be formed on the multilayer wiring structure 2.

In the multilayer wiring structure 2, the first interlayer insulating layer 11, the first etching stop layer 21, the second interlayer insulating layer 12, the second etching stop layer 22, the third interlayer insulating layer 13, the third etching stop layer 23, the fourth interlayer insulating layer 14, the fourth etching stop layer 24, the fifth interlayer insulating layer 15, the fifth etching stop layer 25, the sixth interlayer insulating layer 16, the sixth etching stop layer 26, the seventh interlayer insulating layer 17, the seventh etching stop layer 27, the eighth interlayer insulating layer 18, a capacitive film 70, and the ninth interlayer insulating layer 19 are sequentially stacked in this order on the surface of the semiconductor substrate 1. The interlayer insulating layers 11 to 19 are made of, for example, $SiO_2$. Further, the etching stop layers 21, 23, 25, and 27 are made of, for example, SiCN. The etching stop layers 22, 24, and 26 are configured as stacked films of, for example, SiC and SiCN. The capacitive film 70 is made of, for example, SiN or SiCN.

The first metal wiring 31 may be formed in the same wiring layer (first metal wiring layer) as the second interlayer insulating layer 12. The second metal wiring 32 may be formed in the same wiring layer (second metal wiring layer) as the fourth interlayer insulating layer 14. The third metal wiring 33 may be formed in the same wiring layer (third metal wiring layer) as the sixth interlayer insulating layer 16. The fourth metal wiring 34 may be formed in the same wiring layer (fourth metal wiring layer) as the eighth interlayer insulating layer 18. The first to fourth metal wirings 31 to 34 are wirings (e.g., copper wirings) made of a conductive material using copper as a main ingredient, for example.

The first to fourth metal wirings 31 to 34 may be buried in wiring recesses formed in each of the second, fourth, sixth, and eighth interlayer insulating layers 12, 14, 16, and 18, respectively. More specifically, the first metal wiring 31 may be buried in a wiring recess formed in the second insulating layer 12 by a damascene process. The first metal wiring 31 may be electrically connected to an element (a functional element such as a transistor element or the like) formed on the surface of the semiconductor substrate 1, via a plug 30 buried in the first insulating layer 11. The plug 30 may be made of, for example, tungsten (W). A barrier metal layer 39 (e.g., made of Ta) may be interposed between the plug 30 and the first interlayer insulating layer 11. Further, the second to fourth metal wirings 32 to 34 may be buried in the wiring recesses formed in the fourth, sixth, and eighth interlayer insulating layers 14, 16, and 18, and also, they are buried in vias (holes) formed in the third, fifth, and seventh interlayer insulating layers 13, 15, and 17, through a dual damascene process. The second to fourth metal wirings 32 to 34 may be electrically connected to the immediately underlying metal wirings 31, 32, and 33, respectively. A barrier metal layer 36 may be formed on inner wall surfaces of the wiring recesses and the vias in order to prevent copper from spreading. The first to fourth metal wirings 31 to 34 using copper as a main ingredient may be disposed in a region surrounded by the barrier metal layer 36 and the etching stop layers 22, 24, and 26. The etching stop layers 21, 23, 25, and 27 may be layers for stopping etching performed on the interlayer insulating layers 12, 14, 16, and 18 to form the wiring recesses. Also, the etching stop layers 22, 24, and 26 may be layers for stopping etching performed on the interlayer insulating layers 13, 15, and 17 to form the vias.

As shown in FIG. 2, in some embodiments, two fuse films 4 may be disposed in parallel when viewed from the plane of the semiconductor and formed to have a linear shape (band shape), respectively. These fuse films 4 may electrically connect the uppermost layer wirings 51 and 52 (5) and the uppermost layer wirings 53 and 54 (5), respectively. More specifically, the uppermost wirings 51 and 53 are connected to one end of each of the fuse films 4, and the uppermost layer wirings 52 and 54 are connected to the other end of each of the fuse films 4. The fuse films 4 may be formed in a plug formation layer 10 in which a plug 9 for connecting the uppermost layer wiring 5 (upper wiring layer) to the underlying fourth metal wiring 34 (lower wiring layer) is formed. The plug formation layer 10 may be a layer in which the ninth interlayer insulating layer 19 is formed.

One side or both sides of the uppermost layer wiring 51 and 52 connected to one fuse film 4 may be connected to an internal circuit of the corresponding semiconductor device. Similarly, one side or both sides of the uppermost layer wirings 53 and 54 connected to another fuse film 4 may be connected to the internal circuit of the corresponding semiconductor device. When the fuse film 4 is not cut, the pair of uppermost layer wirings connected to the corresponding fuse film 4 may be electrically connected, and when the fuse film 4 is cut, the electrical connection between the pair of uppermost layer wirings connected to the corresponding fuse film 4 may be electrically disconnected. In this manner, the characteristics of an electronic circuit assembled in the semiconductor device may be adjusted, or a defective portion within the semiconductor device may be separated.

The fuse film 4 includes a first metal film 41 (first metal layer) formed on the capacitive film 70 and a second metal film 42 (second metal layer) formed on the first metal film 41. A barrier metal layer 43 may be formed between the first metal film 41 and the second metal film 42 to prevent the metal material of the second metal film 42 from spreading. The barrier metal layer 43 constitutes a portion of the fuse film 4. More specifically, a recess corresponding to the shape of the fuse film 4 may be formed in the ninth interlayer insulating layer 19 at an upper side of the first metal film 41. A side wall (a side wall of the ninth interlayer insulating layer 19) and a lower surface (a surface of the first metal film 41) of this recess are covered by the barrier metal layer 43. The second metal film 42 may be disposed within the recess covered by the barrier metal layer 43. The second metal film 42 also serves as a fuse plug for connecting the fuse film 4 to the uppermost layer wiring 5 (51 to 54). That is, the second metal film 42 is integrally formed with a fuse plug.

When viewed from the plane, the first metal film 41 may be formed in a larger area (in some embodiments, an area having an elongated rectangular shape corresponding to the shape of the fuse film 4) than the second metal film 42 and the barrier metal layer 43, and the second metal film 42 and the barrier metal layer 43 are within the formation region of the first metal film 41, without a protrusion from the formation region of the corresponding first metal film 41. That is, when viewed from the plane, the second metal film 42 and the barrier metal layer 43 have edges at a position inwardly retreated from the edge of the first metal film 41. In some embodiments, the edges of the second metal film 42 and the barrier metal layer 43 and the edge of the first metal film 41 are spaced apart at a substantially equal interval over the entire circumference.

The first metal film 41 is made of a conductive material that includes a metal other than copper, e.g., TiN, as a main ingredient. Also, the second metal film 42 is made of a conductive material that includes a metal material other than copper, e.g., tungsten (W), as a main ingredient. Further, the barrier metal layer 43 may be configured, for example, as a stacked film formed by sequentially stacking Ta, TaN, Ti, and TiN on the first metal film 41.

The uppermost layer wiring 5 includes, for example, a main body portion 5a, a barrier layer 5b stacked below the main body portion 5a, and a surface metal film 5c stacked at an upper side of the main body portion 5a. The main body portion 5a may be made of a conductive material that includes a metal (e.g., aluminum) other than copper, e.g., AlCu, as a main ingredient, the barrier layer 5b is formed, for example, as a stacked film of Ti and TiN sequentially stacked from a lower side, and the surface metal film 5c is made of, for example, TiN.

As shown in FIG. 2, the sealing member may be formed to have a container-like shape (in some embodiments, a square container-like shape) surrounding the fuse film 4 when viewed from the plane, and is configured by forming the first to fourth metal wirings 31 to 34 in an annular shape (in some embodiments, a square annular shape). Annular vias 61 to 64 are formed to have an annular shape under the first to fourth annular metal wirings 31 and 34 constituting the sealing member 6 such that they correspond to the first to fourth metal wirings 31 to 34. The second to fourth metal wirings 32 to 34 may be formed to bury the immediately underlying annular vias 62 to 64. Further, an annular metal plug 37 may be buried in the annular via 61 immediately under the first metal wiring 31. In some embodiments, the annular metal plug 37 may be connected to a polysilicon wiring layer 38 formed on the semiconductor substrate 1. The polysilicon wiring layer 38 may be formed, for example, on the same layer as that of the polysilicon electrode constituting a transistor gate electrode formed on the semiconductor substrate 1. The annular metal plug 37 may be made of, for example, tungsten (W). A barrier metal layer 39 (e.g., made of Ta) is interposed between the annular metal plug 37 and the first interlayer insulating layer 11.

The capacitor 7 includes a lower electrode 71 (lower electrode layer), a capacitive film 70, and an upper electrode 72 (upper electrode layer). The lower electrode 71 and the upper electrode 72 face each other with the capacitive film 70 interposed therebetween, forming a capacitor structure. The lower electrode 71 may be configured as a portion of the fourth metal wiring 34. The capacitive film 70 may be formed on the fourth metal wiring 34 and the eighth interlayer insulating layer 18. The upper electrode 72 may be formed of a metal film on the same layer as the first metal film 41 of the fuse film 4. The lower electrode 71 may be connected to the uppermost wiring layer 56 (5) with a plug 91 (9) interposed therebetween, and the upper electrode 72 may be connected to the uppermost wiring layer 57 (5) with a plug 92 (9) interposed therebetween. The capacitive film 70 is etched by using the upper electrode 72 and the first metal film 41 as masks, so a film thickness immediately below the upper electrode 72 and the first metal film 41 is greater than that of other portions. The lower electrode 71 may be larger than the upper electrode 72, and has a protrusion extending from the upper electrode 72 when viewed from the plane. At the protrusion, the plug 91 may be connected to the lower electrode 71 through the capacitive film 70.

An opening 46 for an electrical connection (e.g., connection by wire bonding) with respect to the surface of the uppermost layer wiring 5 is formed in the passivation film 3. A portion exposed from the opening 46 in the uppermost layer wiring 5 is a pad 47 to be electrically connected with the outside. Further, an annular opening 48 may be formed at a position immediately above the sealing member 6 in the passivation film 3. The annular opening 48 divides the passivation film 3 into an internal region and an external region of the sealing member 6 when viewed from the plane. Further, a recess portion 49 may be formed by making the passivation film 3 thin in a region (in some embodiments, a rectangular region extending over middle portions of two fuse films 4) including an immediately upper portion of the middle portion of the fuse film 4. The recess portion 49 may be formed simultaneously during an etching process for forming the openings 46 and 48. The recess portion 49 may be used, for example, as a process window for cutting the fuse film 4 (fusion cutting) through laser processing. When the fuse film 4 is cut by the laser processing or the like, and when a crack occurs in the passivation film 3 in the recess portion 49, the crack can be stopped by the annular opening 48, without being spread to the passivation film 3 at the outer side.

In this manner, in the semiconductor device according to some embodiments, at least a portion of the fuse film 4 can be formed on the plug formation layer 10 and the fuse film 4 can be made of a conductive material including metal other than copper as a main ingredient. Thus, when the fuse film 4 is cut, fragments of copper do not scatter, so the semiconductor device is not broken down and operational characteristics thereof are not degraded. In addition, since the fuse film 4 is made of a metallic material other than copper, a cut section is hardly corroded. Thus, a breakdown or a degradation of operational characteristics of the semiconductor device resulting from corrosion starting from the fuse film 4 can be restrained or prevented. In this manner, the semiconductor device which includes the wirings using copper as a main ingredient and has characteristics which are not degraded when cutting the fuse occurs.

Additionally, in some embodiments, the first metal film 41 made of the same material on the same layer as that of the upper electrode 72 of the capacitor 7 constitutes a portion of the fuse film 4. For this reason, as explained later, the fuse film 4 can be formed through the same process as that of the upper electrode 72. Thus, since the fuse film 4 can be formed through a smaller number of processes, an increase in fabrication costs can be restrained.

Further, in some embodiments, the fuse film 4 includes the second metal film 42 made of the same material as that of the plug 9 on the same layer as that of the plug 9. For this reason, as explained later, the fuse film 4 can be formed through the same process as that of the plug 9. Thus, since the fuse film can be formed through a smaller number of processes, an increase in fabrication costs can be restrained. Further, in some embodiments, since the second metal film 42 is also used as a fuse plug, there is no need to additionally form a fuse plug. Thus, the fabrication of the semiconductor device can be further facilitated.

Further, the sealing member 6 may be installed to have the container-like shape to surround the fuse film 4 when viewed from the plane. For this reason, although a crack occurs starting from the fuse film 4 when the fuse film 4 is cut, spreading of the crack can be restrained within the sealing member 6. Accordingly, multilayer wiring structure 2 can be protected, and thus, a breakdown or a degradation of operational characteristics of the semiconductor device can be restrained or prevented.

FIGS. 3A to 3F are sectional views sequentially showing a process of a method for fabricating the semiconductor device, according to some embodiments, in which a process after the formation of the capacitive film 70 is illustrated.

Figure 3A:
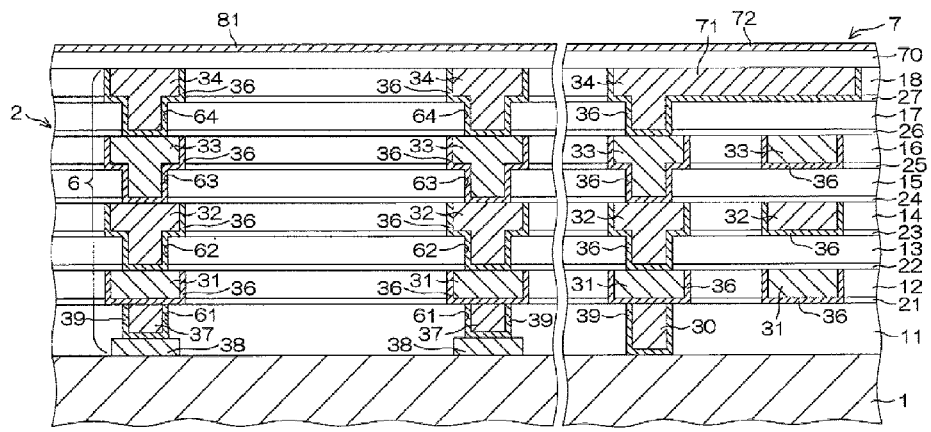
FIG. 3A is a sectional view showing a method for fabricating the semiconductor device, according to some embodiments.

As shown in FIG. 3A, the fourth metal wiring 34 is buried in the eighth interlayer insulating layer 18 and planarized, e.g., through chemical mechanical polishing (CMP), and then, the capacitive film 70 is formed on the planarized surface. The capacitive film 70 can be made of, for example, an insulating material that can prevent, for example, copper (Cu) such as SiN or SiCN from spreading. The capacitive film 70 may be formed to cover the surfaces of the eighth interlayer insulating layer 18 and the fourth metal wiring 14 through, for example, plasma chemical vapor deposition (CVD). Thereafter, an electrode film 81 constituting the upper electrode 72 and the first metal film 41 may be stacked on the capacitive film 70. The electrode film 81 may be made of, for example, TiN, and formed through a sputtering method.

Figure 3B:
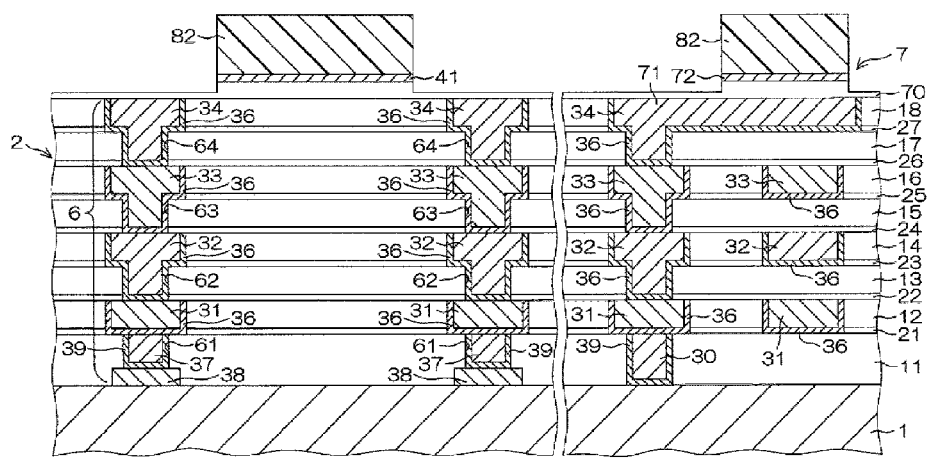
FIG. 3B is a sectional view showing a subsequent process of FIG. 3A.

Next, as shown in FIG. 3B, a resist 82 having a pattern corresponding to the upper electrode 72 and the first metal film 41 is formed, and the electrode film 81 is etched by using the resist 82 as a mask. This etching may be executed until the electrode film 81 in the region exposed from the resist 82 is completely removed. For this reason, in the region exposed from the resist 82, the capacitive film 70 not covered by the upper electrode 72 and the first metal layer 41 is slightly etched (up to the middle of the film thickness). Accordingly, the upper electrode 72 and the first metal film 41 are formed, and the capacitive film 70 positioned immediately under the upper electrode 72 and the first metal film 41 is relatively thick while other regions become relatively thin. Thereafter, the resist 82 is removed.

Figure 3C:
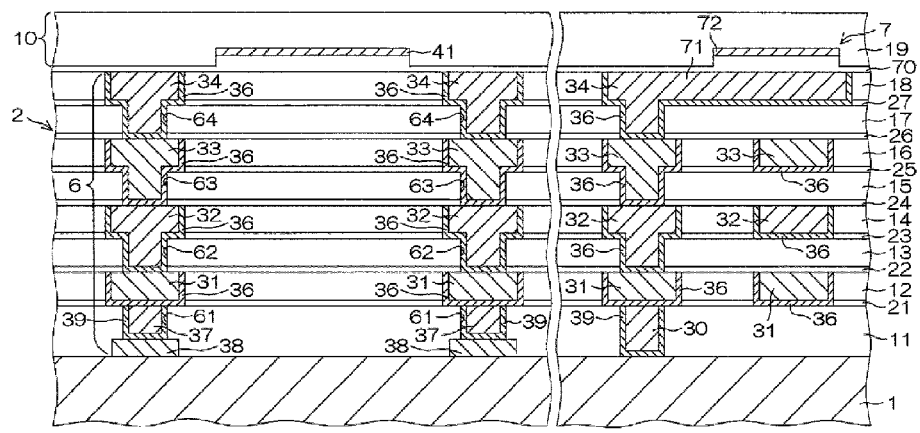
FIG. 3C is a sectional view showing a subsequent process of FIG. 3B.

Next, as shown in FIG. 3C, the ninth interlayer insulating layer 19 may be formed. The ninth interlayer insulating layer 19 may be made of, for example, $SiO_2$, and may be formed through plasma CVD.

Figure 3D:
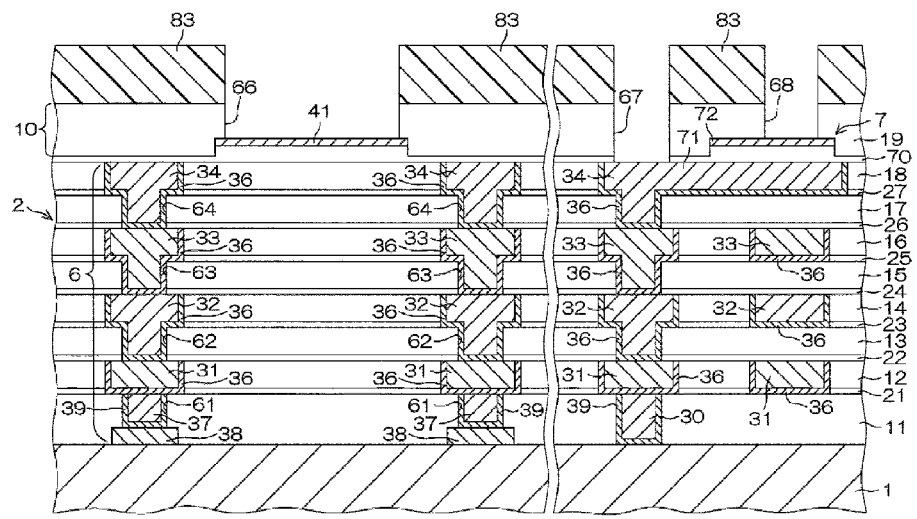
FIG. 3D is a sectional view showing a subsequent process of FIG. 3C.

Next, as shown in FIG. 3D, a resist 83 having openings corresponding to the plug opening 66 for a fuse and contact plug openings 67 and 68 may be formed. The ninth interlayer insulating layer 19 may be etched by the etching using the resist 83 as a mask, and accordingly, the fuse plug opening 66 and the contact plug openings 67 and 68 penetrating the ninth interlayer insulating layer 19 are formed. The fuse plug opening 66 may be positioned in an internal region of the first metal film 41 when viewed from the plane, and the contact plug opening 68 may be positioned in an internal region of the upper electrode 72 when viewed from the plane. Thus, etching of the ninth interlayer insulating layer 19 is stopped at the first metal film 41 and the upper electrode 72. Further, in the contact plug opening 67, etching of the ninth interlayer insulating layer 19 is stopped at the capacitive film 70. That is, the first metal film 41, the upper electrode 72, and the capacitive film 70 serve as etching stop layers. After the ninth interlayer insulating layer 19 is etched, the capacitive film 70 remaining on a lower surface portion of the contact plug opening 67 may be removed to expose a partial surface of the fourth metal wiring 34 constituting the lower electrode 71. The etching of the capacitive film 70 is stopped at the fourth metal wiring 34. Thereafter, the resist 83 is removed.

Figure 3E:
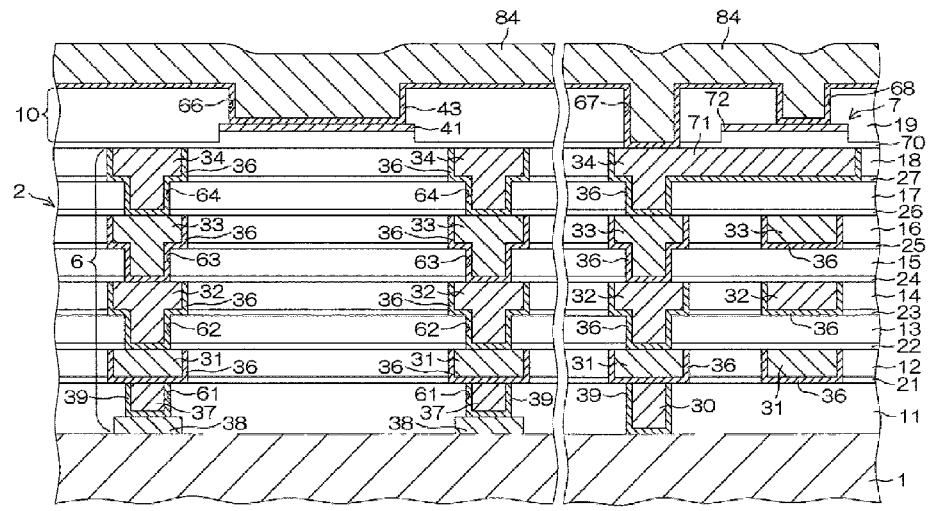
FIG. 3E is a sectional view showing a subsequent process of FIG. 3D.

Next, as shown in FIG. 3E, the barrier metal layer 43 and the electrode film 84 can be formed. The barrier metal layer 43 may be formed to cover the surface (upper surface) of the ninth interlayer insulating layer 19, inner side walls of the plug openings 66, 67, and 68, and the surfaces of the upper electrode 72 exposed from a lower surface of the plug opening, the first metal film 41, and the lower electrode 71. After the formation of the barrier metal layer 43, an electrode film 84 is formed. The electrode film 84 may be made of a metallic material to constitute the second metal film 42 of the fuse film 4 and the plug 9, and may be deposited on the entire surface to completely fill the plug openings 66, 67, and 68. The barrier metal layer 43 can be configured, for example, as a stacked film formed by stacking a Ta film, a TaN film, a Ti film, and a TiN film sequentially from a lower side, and may be formed by sequentially depositing those constituent films through a sputtering method. The electrode film 84 may be made of, for example, tungsten (W), and may be formed through CVD.

Figure 3F:
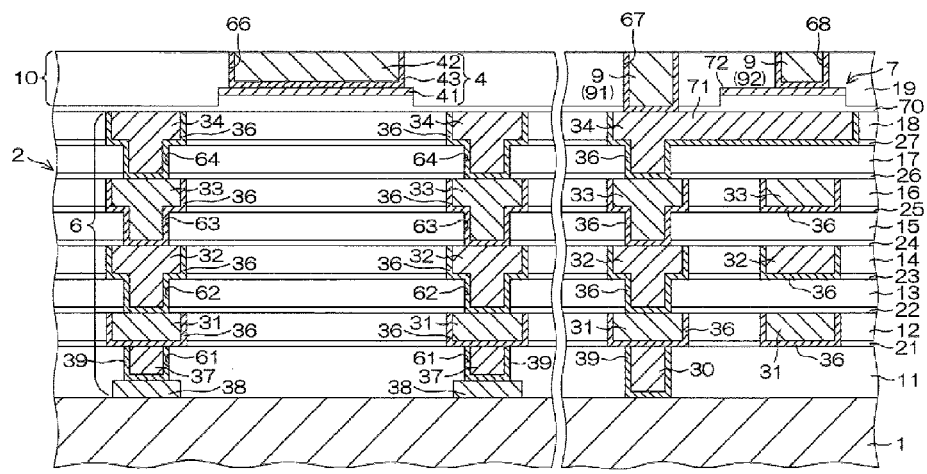
FIG. 3F is a sectional view showing a subsequent process of FIG. 3E.

Next, as shown in FIG. 3F, the surface is planarized by, for example, CMP to remove the electrode film 84 outside the plug openings 66, 67, and 68. Accordingly, the second metal film 42 also serving as a fuse plug may be disposed within the fuse plug opening 66, and the contact plugs 91 and 92 (plugs for an interlayer connection) can be disposed in the contact plug openings 67 and 68.

Thereafter, as shown in FIG. 1, the uppermost layer wiring 5 is formed to have a certain pattern, and the passivation film 3 covering the uppermost layer wiring 5 is formed. Additionally, the pad opening 46, the annular opening 48 on the sealing member 6, and the recess portion 49 as a process window for cutting the fuse are formed by selectively etching the passivation film 3. In this manner, the semiconductor device having the structure illustrated in FIG. 1 is obtained.

Thus, the upper electrode 72 of the capacitor 7 and the first metal film 41 of the fuse film 4 can be formed through the same process, and further, the contact plugs 91 and 92 (plugs for an interlayer connection) and the second metal film 42 of the fuse film 4 can be formed through the same process. Accordingly, the semiconductor device having a structure capable of restraining or preventing a breakdown or a degradation of characteristics resulting from the fuse film 4 can be fabricated through a smaller number of processes.

Further, the fuse plug opening 66 may be formed in a region within the formation region of the first metal film 41 when viewed from the plane, so etching for forming the fuse plug opening 66 can be stopped at the first metal film 41. Thus, a film thickness of the second metal film 42 constituting the fuse film 4 can be accurately controlled. When the first metal film 41 is not formed, if etching conditions (overcoat etching amount) for the contact plug opening 67 are determined to reliably reach the fourth metal wiring 34, the fuse plug opening 66 may become deeper than a required film thickness of the fuse film 4. Therefore, the fuse film 4 has a film thickness that is more than necessary. Thus, for example, when the fuse film 4 is cut (fusion cutting) by laser processing, a required laser light output is increased. Meanwhile, in some embodiments, the first metal film 41 can be previously formed and the fuse plug opening 66 may be formed by using the first metal film 41 as an etching mask, so the film thickness of the second metal film 41 can be controlled to be a required sufficient thickness. Thus, the fuse film 4 can be cut (fusion cutting) by a laser of a low output in a short time.

More specifically, for example, when the thickness of the interlayer insulating layer 19 of the plug formation layer 10 is 700 nm and the overcoat etching amount is 100 nm, if the first metal film 41 is not formed, the film thickness of the second metal film 42 is 800 nm(=700 nm+100 nm). Meanwhile, when the thickness of the first metal film 41 is 40 nm and the underlying capacitive film 70 is 80 nm, the thickness of the second metal film 42 is 580 nm(=700 nm-(80 nm+40 nm)). Thus, by forming the first metal film 41, the thickness of the second metal film 42 made of, for example, tungsten (W), or the like, can become thinner by 220 nm. Accordingly, cutting of the fuse film 4 through laser processing is facilitated.

Figure 4:
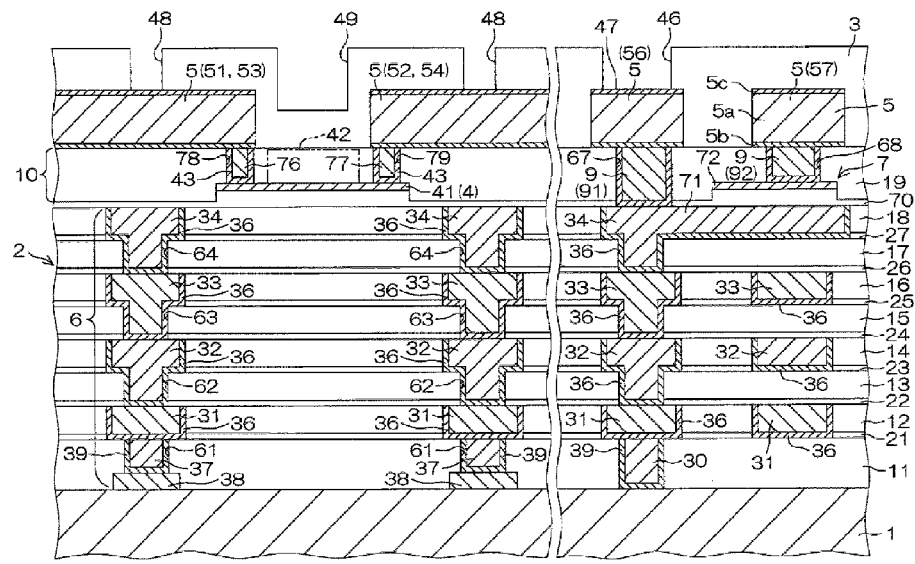
FIG. 4 is a sectional view for explaining the configuration of a major part of a semiconductor device, according to some embodiments.

FIG. 4 is a sectional view for illustrating the configuration of a major part of a semiconductor device according to some embodiments. Certain reference numerals used for certain elements illustrated in FIG. 1 and as described above correspond to the same elements in FIG. 4, and, in the interest of brevity, a repeated description will be omitted for these same elements.

In the semiconductor device of some embodiments, the fuse film 4 may be formed of the first metal film 41. A pair of fuse plugs 76 and 77 can be formed to be in contact with both end portions of the first metal film 41, respectively. The uppermost layer wirings 51, 53, 52, and 54 may be formed to be in contact with the fuse plugs 76 and 77. The fuse plugs 76 and 77 can be buried in fuse plug openings 78 and 79 formed in the ninth interlayer insulating layer 19, respectively. The lower surface (surface of the first metal film 41) and a side wall (the side of the ninth interlayer insulating layer 19) of the fuse plug openings 78 and 79 may be covered by the barrier metal layer 43. The fuse plugs 76 and 77 may be buried in the openings 78 and 79, respectively, such that they are in contact with the barrier metal layer 43. The fuse plugs 76 and 77 may be made of, for example, tungsten (W). Further, the barrier metal layer 43 may be configured, for example, as a stacked film formed by stacking a Ta layer, a TaN layer, a Ti layer, and a TiN layer sequentially from a lower side.

The fuse film 4 positioned immediately under the recess portion 49 (window for fuse cutting) formed in the passivation film 3 may be configured by only the first metal film 41. Thus, cutting of the fuse film 4 is facilitated as compared to the case of some embodiments previously described. Specifically, when the fuse film 4 is cut (fusion cutting) by laser processing, the fuse film 4 can be cut by a laser of a low output in a short time.

Figure 5A:
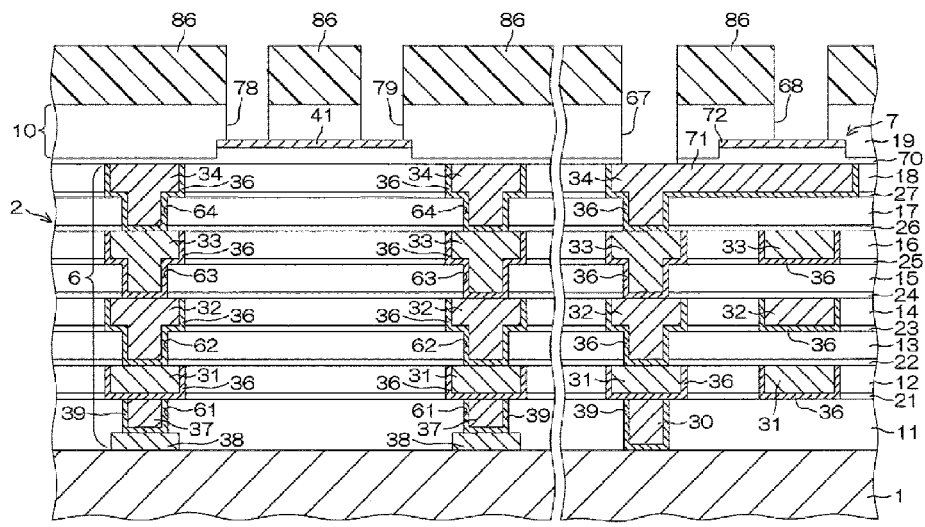
FIG. 5A is a sectional view for explaining a method for fabricating the semiconductor device, according to some embodiments.
Figure 5B:
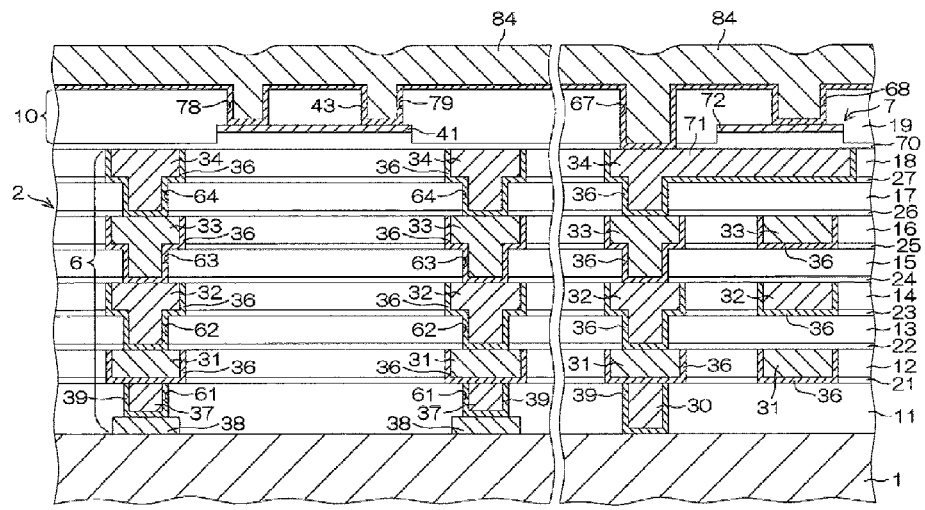
FIG. 5B is a sectional view showing a subsequent process of FIG. 5A.
Figure 5C:
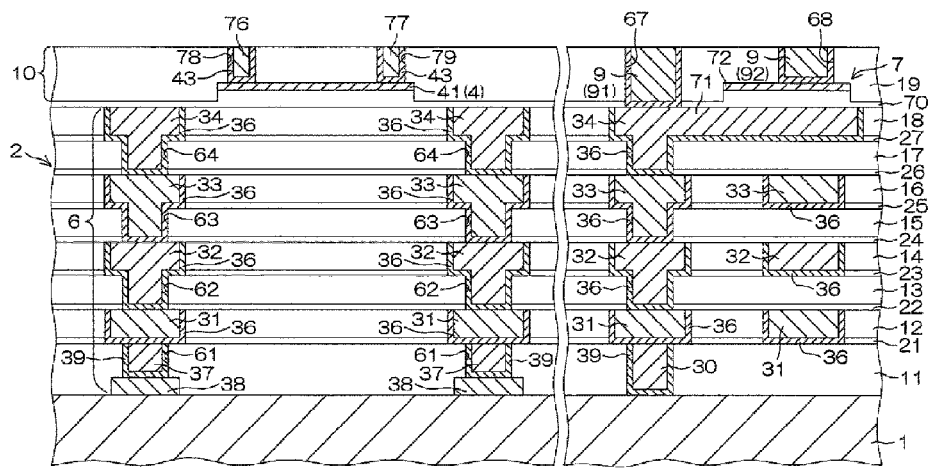
FIG. 5C is a sectional view showing a subsequent process of FIG. 5B.

FIGS. 5A to 5C are sectional views for illustrating a process for fabricating the semiconductor device, according to some embodiments, in which a process after the contact plug opening is formed.

First, similar to the case of the semiconductor device of the foregoing first embodiment, the foregoing process described with reference to FIGS. 3A to 3C also apply to FIGS. 5A to 5C. Thus, in the interest of brevity, the same steps or components sharing the same reference numerals will not be repeated.

As shown in FIG. 5A, a resist 86 having a pattern with openings corresponding to the fuse plug openings 78 and 79 and the contact plug openings 67 an 68 may be formed. The ninth interlayer insulating layer 19 may be etched through etching using the resist 86 as a mask, and accordingly, the fuse plug openings 78 and 79 and the contact plug openings 67 and 68 penetrating the ninth interlayer insulating layer 19 are formed. The fuse plug openings 78 and 79 are positioned within an internal region of the first metal film 41 when viewed from the plane, and the contact plug opening 68 may be positioned within an internal region of the upper electrode 72 when viewed from the plane. Thus, etching of the ninth interlayer insulating layer 19 is stopped at the first metal film 41 and the upper electrode 72. Further, etching of the ninth interlayer insulating layer 19 in the region of the contact plug opening 67 is stopped at the capacitive film 70. That is, the first metal film 41, the upper electrode 72, and the capacitive film 70 serve as etching stop layers. After the ninth interlayer insulating layer 19 is etched, the capacitive film 70 remaining at the lower surface portion of the contact plug opening 67 may be removed to expose a portion of the surface of the fourth metal wiring 34 constituting the lower electrode 71. Thereafter, the resist 86 is removed.

Next, as shown in FIG. 5B, the barrier metal layer 43 and the electrode film 84 are formed. The barrier metal layer 43 may be formed to cover the surface (upper surface) of the ninth interlayer insulating layer 91, the inner walls of the plug openings 78, 79, 67, and 68, and the surfaces of the upper electrodes 72, the first metal film 41, and the lower electrode 71 exposed from lower faces of these plug openings. After the formation of the barrier metal layer 43, an electrode film 84 may be formed. The electrode film 84 can be made of a metallic material to constitute the fuse plugs 76 and 77 and the plug 9, and may be deposited on the entire surface to completely fill the plug openings 78, 79, 67, and 68. The barrier metal layer 43 may be configured, for example, as a stacked film formed by stacking a Ta film, a TaN film, a Ti film, and a TiN film sequentially from a lower side, and may be formed by sequentially depositing those constituent films through a sputtering method. The electrode film 84 may be made of, for example, tungsten (W), and may be formed through CVD.

Next, as shown in FIG. 5C, the surface can be planarized by, for example, CMP to remove the electrode film 84 outside the plug openings 78, 79, 67, and 68. Accordingly, the fuse plugs 76 and 77 are disposed within the fuse plug openings 78 and 79, and the contact plugs 91 and 92 are disposed in the contact plug openings 67 and 68.

Thereafter, as shown in FIG. 1, the uppermost layer wiring 5 may be formed to have a certain pattern, and the passivation film 3 covering the uppermost layer wiring 5 is formed. Additionally, the pad opening 46, the annular opening 48 on the sealing member 6, and the recess portion 49 as a process window for cutting the fuse are formed by selectively etching the passivation film 3. In this manner, the semiconductor device having the structure illustrated in FIG. 4 is obtained.

Figure 6:
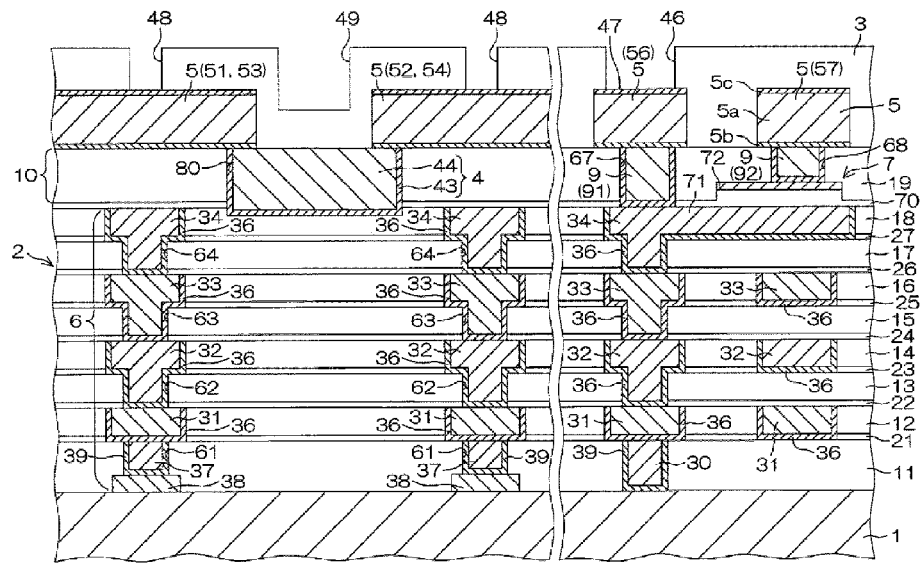
FIG. 6 is a sectional view for explaining the configuration of a major part of a semiconductor device, according to some embodiments.

FIG. 6 is a sectional view for illustrating the configuration of a major part of a semiconductor device, according to some embodiments. In FIG. 6, the same reference numerals are used for the corresponding elements as those illustrated in FIG. 1 as described above, and, in the interest of brevity, a repeated description will be omitted.

In the semiconductor device according to some embodiments, the fuse film 4 may be formed of a metal film 44 equivalent to the second metal film 41 of FIG. 1. The uppermost layer wirings 51, 53, 52, and 54 are formed to be in contact with the surfaces of both end portions of the metal film 44. The metal film 44 is buried in a fuse plug opening 80 formed in the ninth interlayer insulating layer 19. A lower surface and a side wall of the fuse plug opening 80 are covered by the barrier metal layer 43. The metal film 44 is buried in the fuse plug opening 80 such that it is in contact with the barrier metal layer 43. The metal film 44 is made of, for example, tungsten (W). Further, the barrier metal layer 43 is configured, for example, as a stacked film formed by stacking a Ta layer, a TaN layer, a Ti layer, and a TiN layer sequentially from a lower side.

The fuse film 4 positioned immediately under the recess portion 49 (window for fuse cutting) formed in the passivation film 3 is configured to include the metal film 44 and the barrier metal layer 43.

A lower surface of the fuse plug opening 80 is in contact with the eighth interlayer insulating layer 18. This is because the surface layer portion of the eighth interlayer insulating layer 18 is etched for an overcoat etching when the fuse plug opening 80 is formed. Further, a side wall of the fuse plug opening 80 is in contact with the eighth interlayer insulating layer 18, the capacitive film 70, and the ninth interlayer insulating layer 19 sequentially from a lower side, exposing the side surfaces thereof. The metal film 44 buried in the fuse plug opening 80 has a film thickness greater than that of the second metal film 42 of FIG. 1.

FIGS. 7A to 7F are sectional views for illustrating a process of fabricating the semiconductor device according to the third embodiment, in which a process after the formation of the capacitive film 70.

Figure 7A:
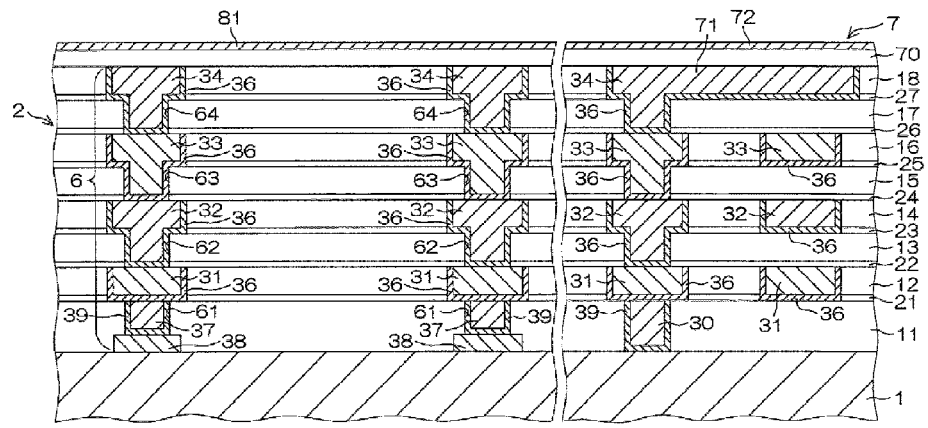
FIG. 7A is a sectional view showing a method for fabricating the semiconductor device, according to some embodiments.

As shown in FIG. 7A, the fourth metal wiring 14 is buried in the eighth interlayer insulating layer 18 and planarized (e.g., through CMP), and then, the capacitive film 70 is formed on the planarized surface. The capacitive film 70 may be made of, for example, an insulating material, for example, SiN or SiCN, that can prevent copper (Cu) from spreading. The capacitive film 70 is formed to cover the surfaces of the eighth interlayer insulating layer 18 and the fourth metal wiring 14 through, for example, plasma CVD. Thereafter, the electrode film 81 constituting the upper electrode 72 and the first metal film 41 is stacked on the capacitive film 70. The electrode film 81 may be made of, for example, TiN, and formed through a sputtering method.

Figure 7B:
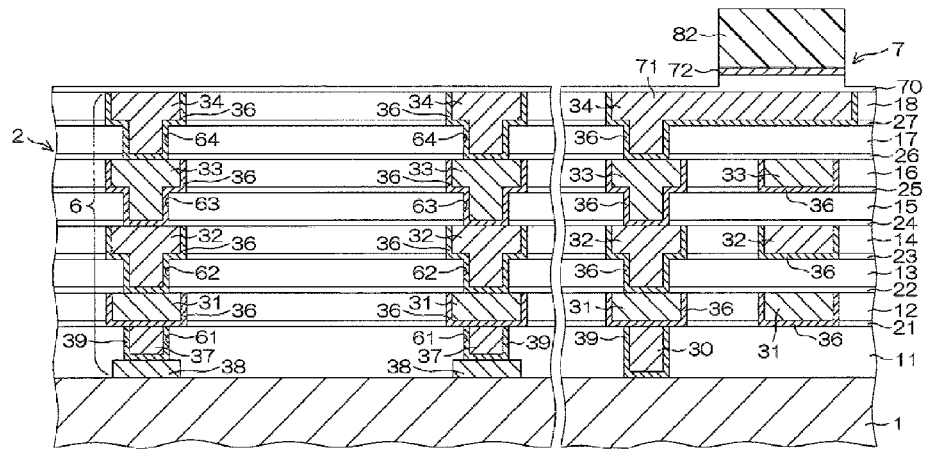
FIG. 7B is a sectional view showing a subsequent process of FIG. 7A.

Next, as shown in FIG. 7B, the resist 82 having a pattern corresponding to the upper electrode 72 may be formed, and the electrode film 81 may be etched by using the resist 82 as a mask. This etching is executed until the electrode film 81 in the region exposed from the resist 82 is completely removed. For this reason, in the region exposed from the resist 82, the capacitive film 70 not covered by the upper electrode 72 is slightly etched (up to the middle of the film thickness). Accordingly, the upper electrode 72 is formed, and the capacitive film 70 positioned immediately under the upper electrode 72 is relatively thick, and other regions become relatively thin. Thereafter, the resist 82 is removed.

Figure 7C:
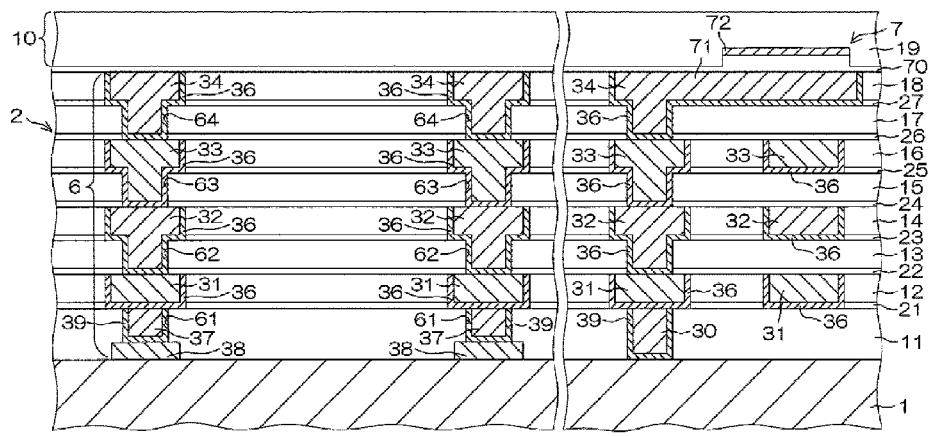
FIG. 7C is a sectional view showing a subsequent process of FIG. 7B.

Next, as shown in FIG. 7C, the ninth interlayer insulating layer 19 may be formed. The ninth interlayer insulating layer 19 may be made of, for example, $SiO_2$, and may be formed through plasma CVD.

Figure 7D:
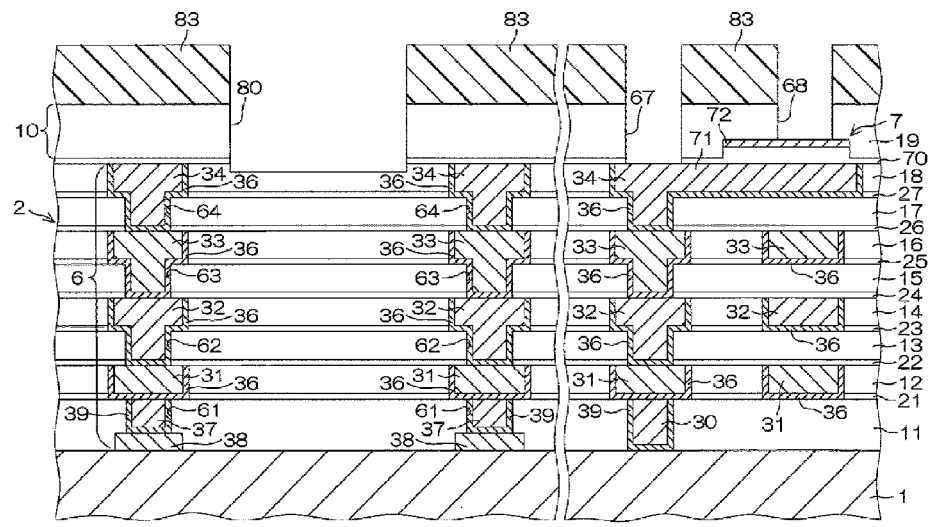
FIG. 7D is a sectional view showing a subsequent process of FIG. 7C.

Next, as shown in FIG. 7D, a resist 83 having openings corresponding to a plug opening 80 for a fuse and contact plug openings 67 and 68 may be formed. The ninth interlayer insulating layer 19 may be etched by the etching using the resist 83 as a mask, and accordingly, the fuse plug opening 80 and the contact plug openings 67 and 68 penetrating the ninth interlayer insulating layer 19 can be formed. The contact plug opening 68 may be positioned in an internal region of the upper electrode 72 when viewed from the plane. Thus, etching of the ninth interlayer insulating layer 19 is stopped at the upper electrode 72. Further, in the fuse plug opening 80 and the contact plug opening 67, etching of the ninth interlayer insulating layer 19 is stopped at the capacitive film 70. After the ninth interlayer insulating layer 19 is etched, the capacitive film 70 remaining at a lower surface portion of the contact plug opening 67 may be removed to expose a partial surface of the fourth metal wiring 34 constituting the lower electrode 71. This etching is stopped at the fourth metal wiring 34. Thereafter, the resist 83 is removed.

The etching of the capacitive film 70 may also be performed at the fuse plug opening 80. Further, since the fourth metal wiring 34 is not installed immediately under the fuse plug opening 80, etching within the fuse plug opening 80 penetrates the capacitive film 70 to reach the surface layer portion of the eighth interlayer insulating layer 18. If this etching condition is not applied, the fourth metal wiring 34 cannot be reliably exposed at the lower surface of the contact plug opening 67.

Figure 7E:
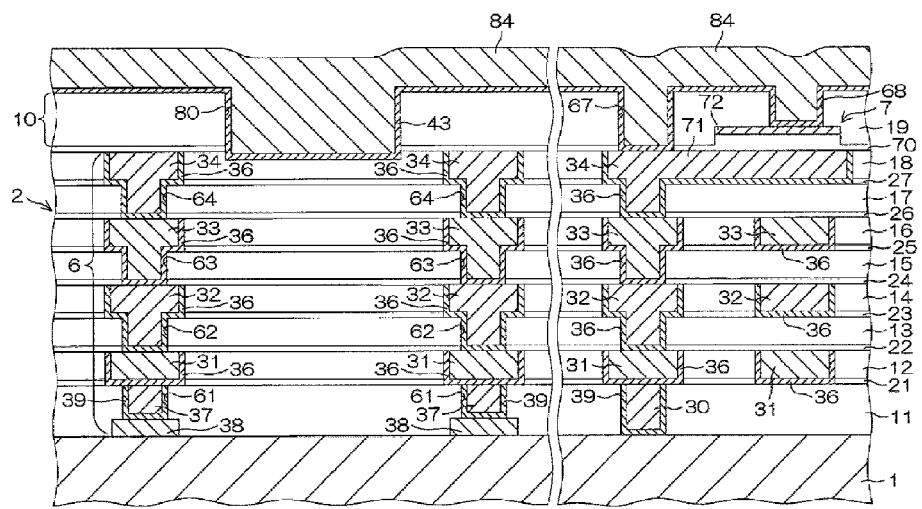
FIG. 7E is a sectional view showing a subsequent process of FIG. 7D.

Next, as shown in FIG. 7E, the barrier metal layer 43 and the electrode film 84 can be formed. The barrier metal layer 43 may be formed to cover the surface (upper surface) of the ninth interlayer insulating layer 19, inner side walls of the plug openings 80, 67, and 68, and the surfaces of the eighth interlayer insulating layer 18, the upper electrode 72, and the lower electrode 71 exposed from lower surfaces of these plug openings 80, 67, and 68. After the formation of the barrier metal layer 43, an electrode film 84 may be formed. The electrode film 84 can be made of a metallic material to constitute the metal film 44 of the fuse film 4 and the plug 9, and may be deposited on the entire surface to completely fill the plug openings 80, 67, and 68. The barrier metal layer 43 is configured, for example, as a stacked film formed by stacking a Ta film, a TaN film, a Ti film, and a TiN film sequentially from a lower side, and may be formed by sequentially depositing the constituent films through a sputtering method. The electrode film 84 may be made of, for example, tungsten (W), and may be formed through CVD.

Figure 7F:
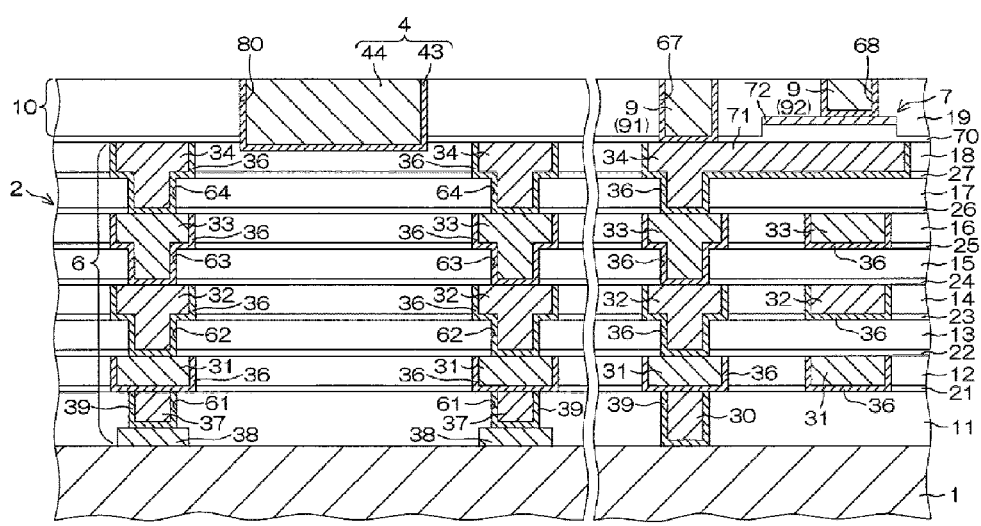
FIG. 7F is a sectional view showing a subsequent process of FIG. 7E.

Next, as shown in FIG. 7F, the surface is planarized by, for example, CMP to remove the electrode film 84 outside the plug openings 66, 67, and 68. Accordingly, the metal film 44 also serving as a fuse plug may be disposed within the fuse plug opening 80, and the contact plugs 91 and 92 can be disposed in the contact plug openings 67 and 68.

Next, as shown in FIG. 6, the uppermost layer wiring 5 is formed to have a certain pattern, and the passivation film 3 covering the uppermost layer wiring 5 may be formed. And, the pad opening 46, the annular opening 48 on the sealing member 6, and the recess portion 49 as a process window for cutting the fuse are formed by selectively etching the passivation film 3. In this manner, the semiconductor device having the structure illustrated in FIG. 6 may be obtained.

Various embodiments have been described, but the present disclosure may also be implemented in other ways. For example, as indicated by the two point chain line in FIG. 4, the fuse film 4 may have the second metal film 42 separated from the fuse plugs 76 and 77. In some embodiments, the second metal film 42 is made of the same material on the same layer (plug formation layer 10) as that of the fuse plugs 76 and 77. Further, in the configuration of FIG. 4, the fuse plugs 76 and 77 may be widened in a length direction of the fuse film 4 (horizontal direction in FIG. 4) to protrude from the edge portions of the uppermost layer wiring 5 towards the recess portion 49 (cutting process window).

Further, the number of wiring layers of the multilayer wiring structure 2 is not limited to the foregoing embodiments, and the number of the wiring layers may be changed to a certain number or any reasonable number.

Figure 8:
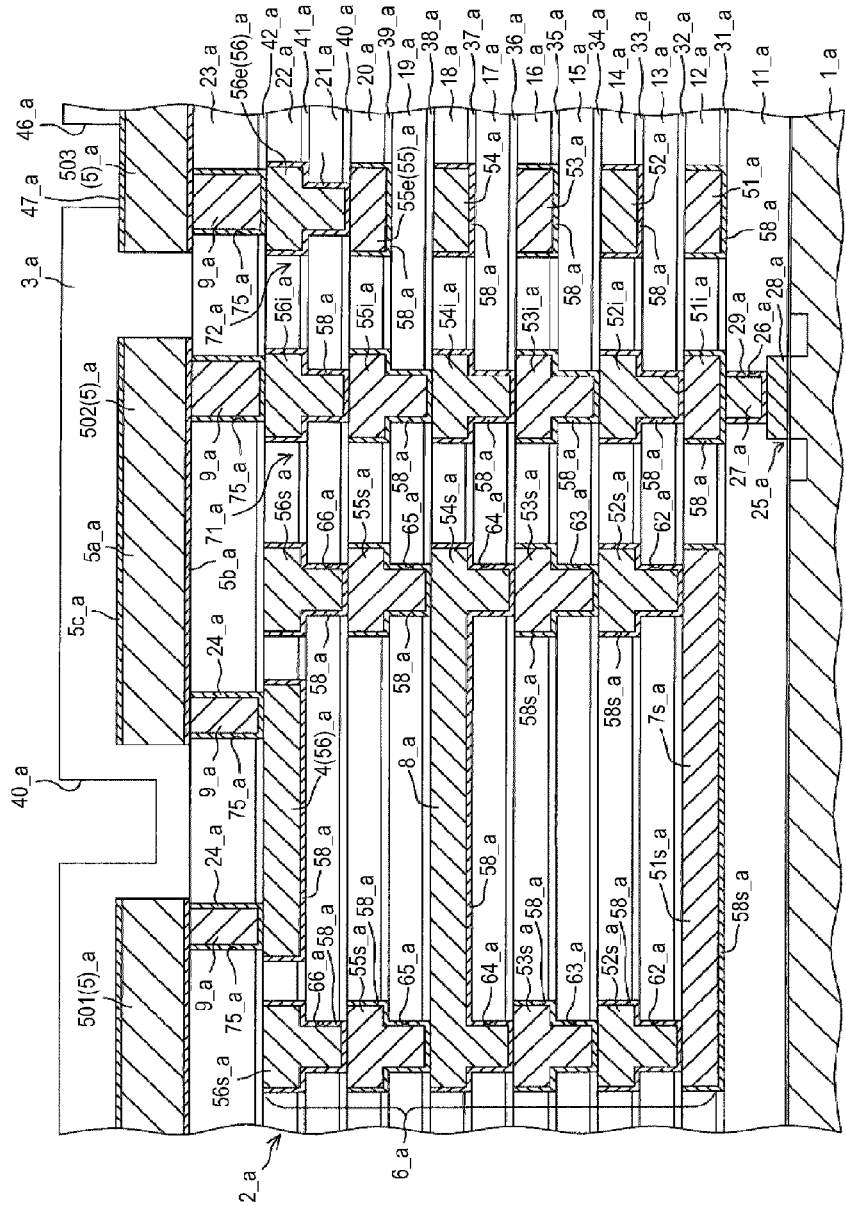
FIG. 8 is a partial sectional view of a semiconductor device, according to some embodiments.
Figure 9:
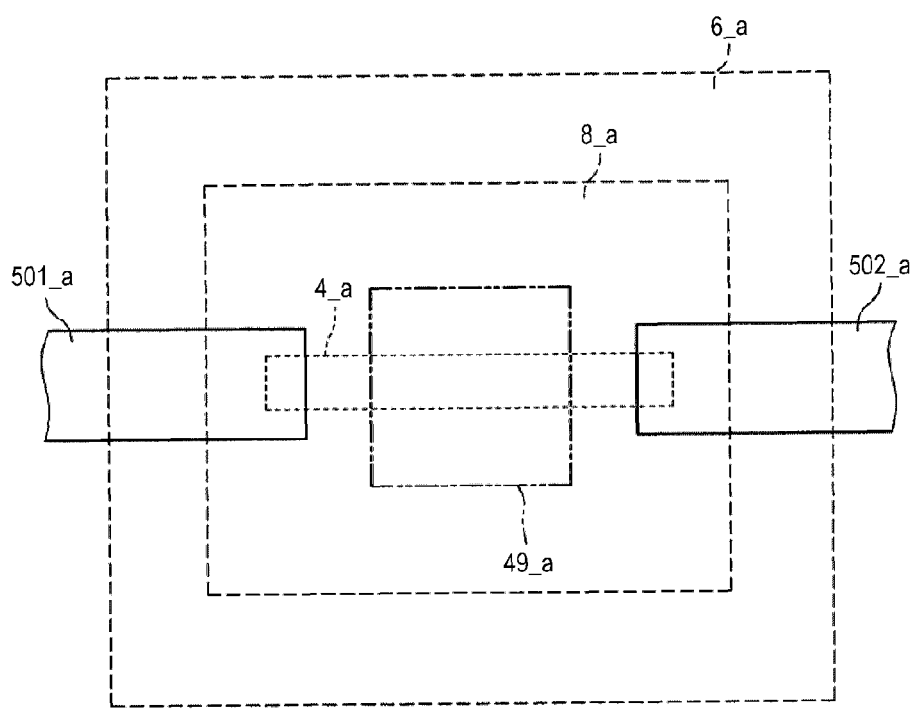
FIG. 9 is a partial plan view of the configuration illustrated in FIG. 8.

FIG. 8 is a sectional view for illustrating the configuration of a major part of a semiconductor device according to another embodiment. FIG. 9 is a partial plan view of the configuration illustrated in FIG. 8. FIGS. 10A to 10E are sectional views sequentially showing a process of a method for fabricating the semiconductor device.

The semiconductor device illustrated in FIG. 8 includes a semiconductor substrate 1_*a*, a multilayer wiring structure 2_*a* formed on a surface of the semiconductor substrate 1_*a*, and a passivation film (surface protective film) 3_*a* covering the multilayer wiring structure 2_*a*. The semiconductor substrate 1_*a* may be a silicon substrate, and a functional element (semiconductor element) (not shown) represented by an active element such as a transistor or the like is formed on a surface layer portion of the semiconductor substrate 1_*a*. The multilayer wiring structure 2_*a* includes interlayer insulating films 11_*a*~23_*a*, etching stop layers 31_*a*~42_*a*, copper wiring layers 51_*a*~56_*a*, a fuse film 4_*a* (copper fuse), an uppermost layer wiring 5_*a* (a wiring film, an external connection layer), and the like. The passivation film 3_*a* may be formed of, for example, a nitride film (silicon nitride film) and covers a surface of the uppermost layer wiring 5_*a*. In FIG. 9, an illustration of the passivation film 3_*a* is omitted.

In the present embodiment, the multilayer wiring structure 2_*a* includes a copper sealing member 6_*a* formed to have a cylindrical shape (e.g., a square cylindrical or container-like shape) surrounding the fuse film 4_*a*, and seal films 7_*a* and 8_*a* (copper seal films) having a flat plate-like shape disposed at a lower portion and a middle portion in a height direction of the copper sealing member 6_*a*, respectively, when viewed from a plane. In the multilayer wiring structure 2_*a*, the interlayer insulating film 11_*a*, the etching stop layer 31_*a*, the interlayer insulating film 12_*a*, the etching stop layer 32_*a*, the interlayer insulating film 13_*a*, the etching stop layer 33_*a*, the interlayer insulating film 14_*a*, the etching stop layer 34_*a*, the interlayer insulating film 15_*a*, the etching stop layer 35_*a*, the interlayer insulating film 16_*a*, the etching stop layer 36_*a*, the interlayer insulating film 17_*a*, the etching stop layer 37_*a*, the interlayer insulating film 18_*a*, the etching stop layer 38_*a*, the interlayer insulating film 19_*a*, the etching stop layer 39_*a*, the interlayer insulating film 20_*a*, the etching stop layer 40_*a*, the interlayer insulating film 21_*a*, the etching stop layer 41_*a*, the interlayer insulating film 22_*a*, the etching stop layer 42_*a*, and the interlayer insulating film 23_*a* are stacked in this order, starting from the surface of the semiconductor substrate 1_*a*. The interlayer insulating films 11_*a*~23 are made of, for example, $SiO_2$. Further, the etching stop layers 31_*a*, 33_*a*, 35_*a*, 37_*a*, 39_*a*, and 41_*a* are made of, for example, SiCN. The etching stop layers 32_*a*, 34_*a*, 36_*a*, 38_*a*, 40_*a*, and 42_*a* are formed of, for example, a stacked film with SiC and SiCN.

Copper wiring layers 51_*a* (51s_*a*, 51i_*a*, 51e_*a*) are formed in the interlayer insulating film 12_*a*, copper wiring layers 52_*a* (52s_*a*, 52i_*a*, 52e_*a*) are formed in the interlayer insulating film 14_*a*, copper wiring layers 53_*a* (53s_*a*, 53i_*a*, 53e_*a*) are formed in the interlayer insulating film 16_*a*, copper wiring layers 54_*a* (54s_*a*, 54i_*a*, 54e_*a*) are formed in the interlayer insulating film 18_*a*, copper wiring layers 55_*a* (55s_*a*, 55i_*a*, 55e_*a*) are formed in the interlayer insulating film 20_*a*, and copper wiring layers 56_*a* (56s_*a*, 56i_*a*, 56e_*a*) are formed in the interlayer insulating film 22_*a*. The copper wiring layers 51_*a*~56_*a* are wirings (copper wirings) made of an electrically conductive material including copper as a main ingredient. These copper wiring layers 51_*a*~56_*a* are buried in wiring recesses respectively formed in the interlayer insulating films 12_*a*, 14_*a*, 16_*a*, 18_*a*, 20_*a*, and 22_*a*. More specifically, the copper wiring layer 51_*a* is buried in the wiring recess formed in the interlayer insulating film 12_*a* by a damascene process. In addition, the copper wiring layers 52_*a*~56_*a* are buried in the wiring recesses respectively formed in the interlayer insulating films 14_*a*, 16_*a*, 18_*a*, 20_*a*, and 22_*a* by a dual damascene process, and also buried in vias (holes) respectively formed in the interlayer insulating films 13_*a*, 15_*a*, 17_*a*, 19_*a*, and 21_*a*. Accordingly, the copper wiring layers 52_*a*~56_*a* are electrically connected to the copper wiring layers 51_*a*~55_*a* which are immediately below the copper wiring layers 52_*a*~56_*a*, respectively.

A barrier metal layer 58_*a* is formed on inner wall surfaces of the wiring recesses and the vias in order to prevent the spread of copper. The copper wiring layers 51_*a*~56_*a* including copper as a main ingredient are disposed in regions surrounded by the barrier metal layer 58_*a* and the etching stop layers 32_*a*, 34_*a*, 36_*a*, 38_*a*, 40_*a*, and 42_*a*. The etching stop layers 31_*a*, 33_*a*, 35_*a*, 37_*a*, 39_*a*, and 41_*a* are layers for stopping etching which is performed on the interlayer insulating films 12_*a*, 14_*a*, 16_*a*, and 18_*a* to form the wiring recesses. Also, the etching stop layers 32_*a*, 34_*a*, 36_*a*, 37_*a*, 38_*a*, and 40_*a* are layers for stopping etching which is performed on the interlayer insulating films 13_*a*, 15_*a*, 17_*a*, 19_*a*, and 21_*a* to form the vias. The barrier metal layer 58_*a* is formed of a stacked film of, for example, a Ta layer and a TaN layer, and the Ta layer is in contact with the copper wiring layer.

In this embodiment, the fuse film 4_a has a linear shape (band-like shape) when viewed from a side cross sectional view. The fuse film 4_a electrically connects the uppermost wirings 501_a and 502(5)_a. Specifically, the uppermost wiring 501_a (a first connection portion) is connected to one end (a first portion) of the fuse film 4_a, and the uppermost wiring 502_a (a second connection portion) is connected to the other end (a second portion) of the fuse film 4_a.

Both ends of the fuse film 4_a are electrically connected to the uppermost wirings 501(5)_a and 502(5)_a, respectively, through plugs 9_a for connecting the uppermost wiring 5_a (upper wiring layer) to the underlying copper wiring layer 56_a (lower wiring layer). The plug 9_a is made of metal buried in an opening formed in the uppermost interlayer insulating film 23_a. More specifically, openings (through-holes) corresponding to the plugs 9_a are formed in the interlayer insulating film 23_a. The inner surface (a lower surface and side wall surfaces) of the opening is covered by a barrier metal layer 24_a. Then, the plug 9_a is buried in the opening surrounded by the barrier metal layer 24_a. The plug 9_a is made of, for example, an electrically conductive material, for example, tungsten (W), including a metallic material, other than copper, as a main ingredient. The barrier metal layer 24_a is a conductive layer having the properties of preventing the spread of the material of the plug 9_a and the material of the fuse film 4_a, and is configured as, for example, a stacked film formed by sequentially stacking Ta, TaN, Ti, and TiN, starting from the fuse film 4_a.

The fuse film 4_a is formed by a portion of the copper wiring layer 56_a formed at the uppermost layer among the copper wiring layers 51_a~56_a. More specifically, a recess corresponding to the shape of the fuse film 4_a is formed in the interlayer insulating film 22_a corresponding to the copper wiring layer 56_a. The inner wall surface (a lower surface and a side wall surface) of the recess is covered by the barrier metal layer 58_a, and a metallic material (a metallic material including copper as a main ingredient) constituting the copper wiring layer 56_a is buried in the recess surrounded by the barrier metal layer 58_a, constituting the fuse film 4_a. Since the barrier metal layer 58_a that is in contact with the fuse film 4_a also contributes to the electrical connection between the uppermost wirings 501_a and 502_a, the barrier metal layer 58_a may be also regarded as a portion of the fuse film.

The uppermost wiring 5_a is a wiring film including, for example, a main body portion 5a_a, a barrier layer 5b_a stacked under the main body portion 5a_a, and a surface metal film 5c stacked on the main body portion 5a_a. The main body portion 5a_a is made of a conductive material, e.g., AlCu, including a metal (e.g., aluminum), other than copper, as a main ingredient, and the barrier layer 5b_a is configured as, for example, a stacked film formed by sequentially stacking Ti and TiN from the bottom.

As shown in FIG. 9, the copper sealing 6_a is formed to have a cylindrical shape (a square container-like shape in this embodiment) surrounding the fuse film 4_a when viewed from a side cross-sectional view, and configured by the copper wiring layers 51_a~56_a. Hereinafter, the copper wiring layers 51_a~56_a constituting the copper sealing member 6_a will be referred to as copper wiring layers 51s_a~56s_a or the like. Among the copper wiring layers constituting the copper sealing member 6_a, the copper wiring layers 52s_a, 53s_a, 55s_a, and 56s_a have an annular shape (a square annular shape in this embodiment) and overlap with each other when viewed from the plane. Also, among the copper wiring layers constituting the copper sealing member 6_a, the lowermost copper wiring layer 51s_a and the copper wiring layer 54s_a positioned above the lowermost copper wiring 51s_a with an interval corresponding to two cooper wiring layers in this embodiment) therebetween are formed in a solid shape (a square shape in this embodiment) having an outline corresponding to the container-like shape of the copper sealing member 6_a when viewed from a side cross-sectional view. An annular portion (a square annular portion in this embodiment) of the circumference of the copper wiring layers 51s_a and 54s_a constitute a portion of the copper sealing member 6_a. Further, in the copper wiring layers 51s_a and 54s_a, a central portion continued to the interior of the annular portion constitutes the seal films 7_a and 8_a interposed between the fuse film 4_a and the semiconductor substrate 1_a. In this embodiment, the copper sealing member 6_a and the seal films 7_a and 8_a are integrated. That is, the copper sealing member 6_a and the seal films 7_a and 8_a are coupled without a gap therebetween.

The upper seal film 8_a is positioned below the fuse film 4_a with an interval (corresponding to the wiring layer of the copper wiring layer 55_a) therebetween from the fuse film 4_a. Further, the seal films 7_a and 8_a are formed such that the fuse film 4_a fits into the inner side of the outer circumference of the seal films 7_a and 8_a when viewed from a side cross-sectional view. Annular vias 62_a~66_a are formed to have an annular shape corresponding to the planar shape of the copper sealing member 6_a below the copper wiring layers 52s_a~56s_a constituting the copper sealing member 6_a. The copper wiring layers 52s_a~56s_a are formed so as to fill the annular vias 62_a~66_a directly below the copper wiring layer 52s_a~56s_a. Thus, a hermetically closed space surrounded by the copper wiring layers 51s_a~54s_a and a semi-hermetically closed space surrounded by the copper wiring layers 54s_a~56s_a are formed at the inner side of the copper sealing 6_a. The fuse film 4_a is disposed in the semi-hermetically closed space (at an upper end position of the corresponding space in this embodiment).

Meanwhile, the uppermost wiring 502_a electrically connected to one end of the fuse film 4_a extends to an outer side of the copper sealing member 6_a when viewed from a side cross sectional view. Further, in the outer side the copper sealing member 6_a, the uppermost wiring 502_a is electrically connected to an element (e.g., a transistor element) 25_a formed on the semiconductor substrate 1_a through the copper wiring layers 51_a~56_a (which are called copper wiring layers 51_ai~56i_a or the like, hereinafter) constituting an internal connection circuit 71_a. More specifically, the uppermost wiring 502_a is connected to the copper wiring layer 56i_a through the plug 9_a formed outside the copper sealing 6_a. The copper wiring layer 56i_a is connected to the underlying copper wiring layer 55i_a, which is further connected to the underlying copper wiring layer 54i_a. In a similar structure, the copper wiring layer 56i_a is connected to the lowermost copper wiring layer 51_ai. Also, the copper wiring layer 51_ai is bonded to a metal plug 27 buried in the via 26_a which is formed in the interlayer insulating film 11_a. In this embodiment, the metal plug 27_a is connected to a polysilicon wiring layer 28_a formed on the semiconductor substrate 1_a. The polysilicon wiring layer 28_a may constitute, for example, a gate electrode of the element 25_a formed on the semiconductor substrate 1_a. The metal plug 27_a is made of, for example, tungsten (W). A barrier metal layer 29_a (which is made of, for example, Ta) is interposed between the metal plug 27_a and the interlayer insulating film 11_a.

In the multilayer wiring structure 2_a, outside the copper sealing member 6_a, there is an external connection circuit 72_a (which includes, for example, the copper wiring layers 55e_a and 56e_a) for connection with the outside of the semiconductor device. The copper wiring layer 56e_a (56_a) constituting a portion of the external connection circuit 72_a is connected through the plug 9_a to the uppermost wiring 503(5)_a as an external connection layer. An opening 46_a for electrical connection (e.g., connection through wire bonding) to the surface of the uppermost wiring 503(5)_a is formed in the passivation film 3_a. A portion exposed from the opening 46_a in the uppermost wiring 5_a is a pad 47_a for electrical connection with the outside. Further, a concave portion 49_a formed by thinning the passivation film 3_a is formed at a region (a square region across the middle region of the fuse film 4_a in this embodiment) including an immediately upper portion of a middle portion of the fuse film 4_a. The concave portion 49_a may be simultaneously formed in an etching process for forming the opening 46_a. The concave portion 49_a is used as, for example, a cutting process window when the fuse film 4_a is cut (fused) through laser machining.

In this manner, in the semiconductor device, the seal films 7_a and 8_a made of copper films are formed between the semiconductor substrate 1_a and the fuse film 4_a made of a copper film, and also, the fuse film 4_a is surrounded by the cylindrical copper sealing member 6_a coupled to the seal films 7_a and 8_a. Thus, the fuse film 4_a is surrounded by the seal films 7_a and 8_a and the copper sealing member 6_a at a lower side (the semiconductor substrate 1_a side) and a lateral side of the fuse film 4_a. For this reason, although copper fragments scatter when the fuse film 4_a is cut, the spread of copper atoms can be stopped by the seal films 7_a and 8_a and/or the copper sealing member 6_a. Accordingly, since the spread of the copper atoms in a horizontal direction and a downward direction can be restrained, the copper atoms can be restrained or prevented from reaching the vicinity of the surface of the semiconductor substrate 1_a. Thus, the functional element (the active element represented by a transistor, or the like) formed on the semiconductor substrate 1_a can be restrained or prevented from being broken down or deteriorated in its operational characteristics (e.g., withstand voltage).

Further, the fuse film 4_a is connected to the uppermost wirings 501_a and 502_a made of metal material films other than copper and formed above the fuse film 4_a. If the fuse film 4_a is not cut, the uppermost wirings 501_a and 502_a are electrically connected, and if the fuse film 4_a is cut, the electrical connection between the uppermost wirings 501_a and 502_a are cut off. In this manner, it is possible to adjust the characteristics of the electronic circuit that is built into the semiconductor device, or disconnect the defects in the semiconductor device.

The fuse film 4_a is connected to the internal connection circuit 71 through the uppermost wiring 502_a. As such, since the fuse film 4_a can be connected to the internal circuit of the semiconductor device through the upper wiring layer, there is no need to form a wiring portion for connecting the fuse film 4_a to the circuit between the fuse film 4_a and the semiconductor substrate 1_a. Thus, the lower surface of the fuse film 4_a (between the fuse film 4_a and the semiconductor substrate 1_a) can be covered by the seal films 7_a and 8_a, and also, the seal films 7_a and 8_a and the copper sealing member 6_a can be combined in seamless manners. Accordingly, the spread of the copper atoms to the surface of the semiconductor substrate 1_a can be restrained or prevented when connecting the fuse film 4_a to the internal connection circuit 71. If the connection to the internal connection circuit 71 is intended to be achieved only in the wiring layer lower than the fuse film 4_a, the lower side and the lateral side of the fuse film 4_a cannot be completely covered, resulting in a failure of avoiding the spread of copper atoms toward the surface of the semiconductor substrate 1_a.

In addition, in this embodiment, the uppermost wiring 5_a to which the fuse film 4_a is connected and the plug 9_a between the uppermost wiring 5_a and the fuse film 4_a are made of metallic material film other than copper. Thus, corrosion from the cut surface of the fuse film 4_a is stopped at the corresponding plug 9_a and/or the uppermost wiring 5_a. Accordingly, since no corrosion reaches the vicinity of the surface of the semiconductor substrate 1_a, a breakdown of the functional element formed on the semiconductor substrate 1_a or deterioration in the operational characteristics of the functional element can be restrained or prevented.

Further, for example, when the fuse film 4_a is cut by laser light, laser light can be reflected from the seal film 8_a toward the fuse film 4_a. Accordingly, energy of laser light can be effectively used to cut the fuse film 4_a. Therefore, since less laser energy may be used for cutting (fusing) the fuse film 4_a, the fuse film 4_a can be cut by a laser with low output in a short time. The seal film 8_a covering the fuse film 4_a from the lower side is formed to have a larger area than that of the fuse film 4_a, so the seal film 8_a is not easily heated even when irradiated with laser light. Thus, the fuse film 4_a can be cut without damaging the seal film 8_a.

In addition, in this embodiment, the fuse film 4_a is connected to the internal connection circuit 71 through the uppermost wiring 502_a formed in the same layer as that of the uppermost wiring 503_a for an external connection. Thus, the semiconductor device including the fuse film 4_a made of a copper film can be fabricated through a smaller number of fabrication processes. Also, the fuse film 4_a is formed in the same layer as the uppermost copper wiring layer 56_a. Therefore, for example, a small amount of energy can be used when the fuse film 4_a is cut by laser light. In addition, since the distance from the semiconductor substrate 1_a to the fuse film 4_a can be increased, the influence on the element formed on the semiconductor substrate 1_a can be further restrained.

Figure 10A:
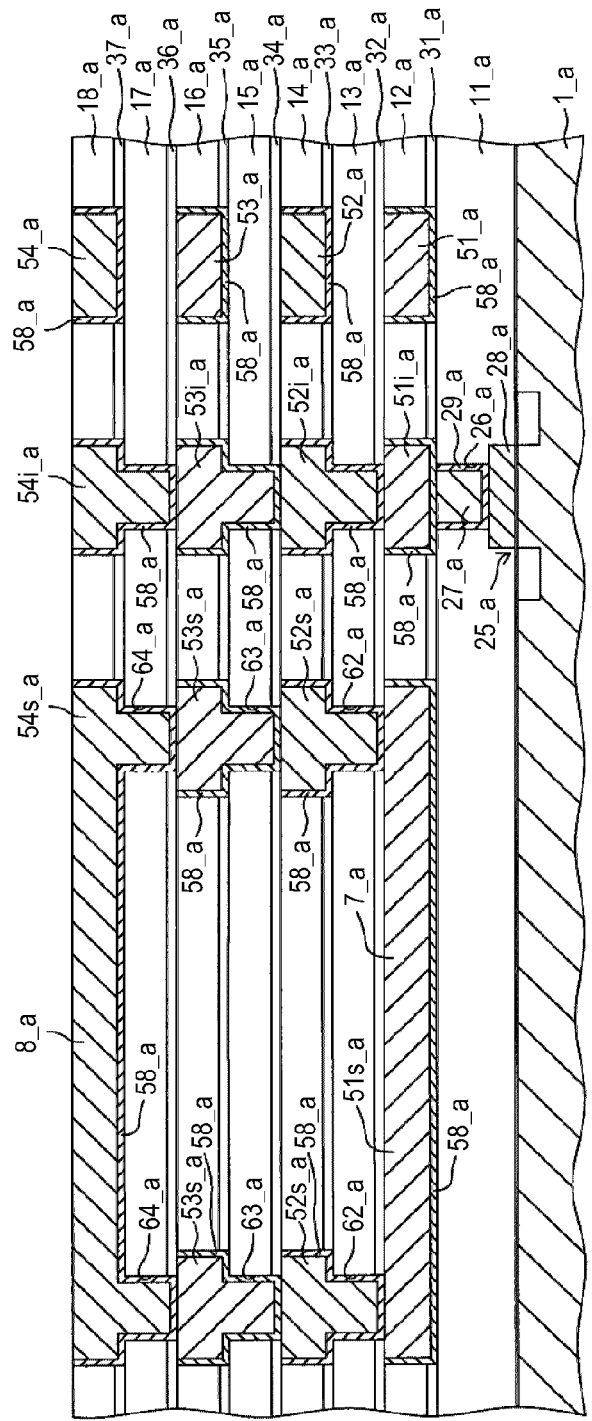
FIG. 10A is a sectional view showing a method for fabricating the semiconductor device, according to some embodiments.

FIGS. 10A to 10E are sectional views sequentially illustrating the processes of a method for fabricating the semiconductor device illustrated in FIG. 8, which specifically show the processes after a formation of the copper wiring layer 54_a. As shown in FIG. 10A, the copper wiring layer 54_a including the seal film 8_a is formed on the interlayer insulating film 17_a (the first interlayer insulating film) by a dual-damascene process. More specifically, the interlayer insulating film 17_a, the etching stop layer 37_a, and the interlayer insulating film 18_a are stacked. Thereafter, a wiring recess that penetrates the interlayer insulating film 18_a and the etching stop layer 37_a is formed in a position where the copper wiring layer 54_a (including the seal film 8_a) is disposed. Further, a via that penetrates the interlayer insulating film 17_a and the etching stop layer 36_a is formed where the via (including the annular via 64_a) directly below the copper wiring layer 54_a is disposed. Etching for forming the wiring recess in the interlayer insulating film 18_a is stopped by the etching stop layer 37_a. Thereafter, the etching stop layer 37_a on the bottom surface of the corresponding wiring recess is opened. Further, a via is formed by etching the interlayer insulating film 17_a directly below the wiring recess. The etching for forming the via is stopped by the etching stop layer 36_a. Thereafter, etching is performed to open the etching stop layer 36_a at a bottom surface of the via. And then, the barrier metal layer 58_a is formed on the surface of the wiring recess, an inner wall surface of the via, and the surface of the interlayer insulating film 18_a, and a copper film is formed to coat the barrier metal layer 58_a. Then, the copper film and the barrier metal layer 58_a are planarized through a chemical mechanical polishing (CMP) method until the surface of the interlayer insulating film 18_a is exposed, such that the copper film and the barrier metal layer 58_a remain only within the wiring recess and the via. Accordingly, the structure illustrated in FIG. 10A is obtained. Although not shown, the copper wiring layers 51_a~53_a (including the seal film 7_a) are also formed through the same process.

Figure 10B:
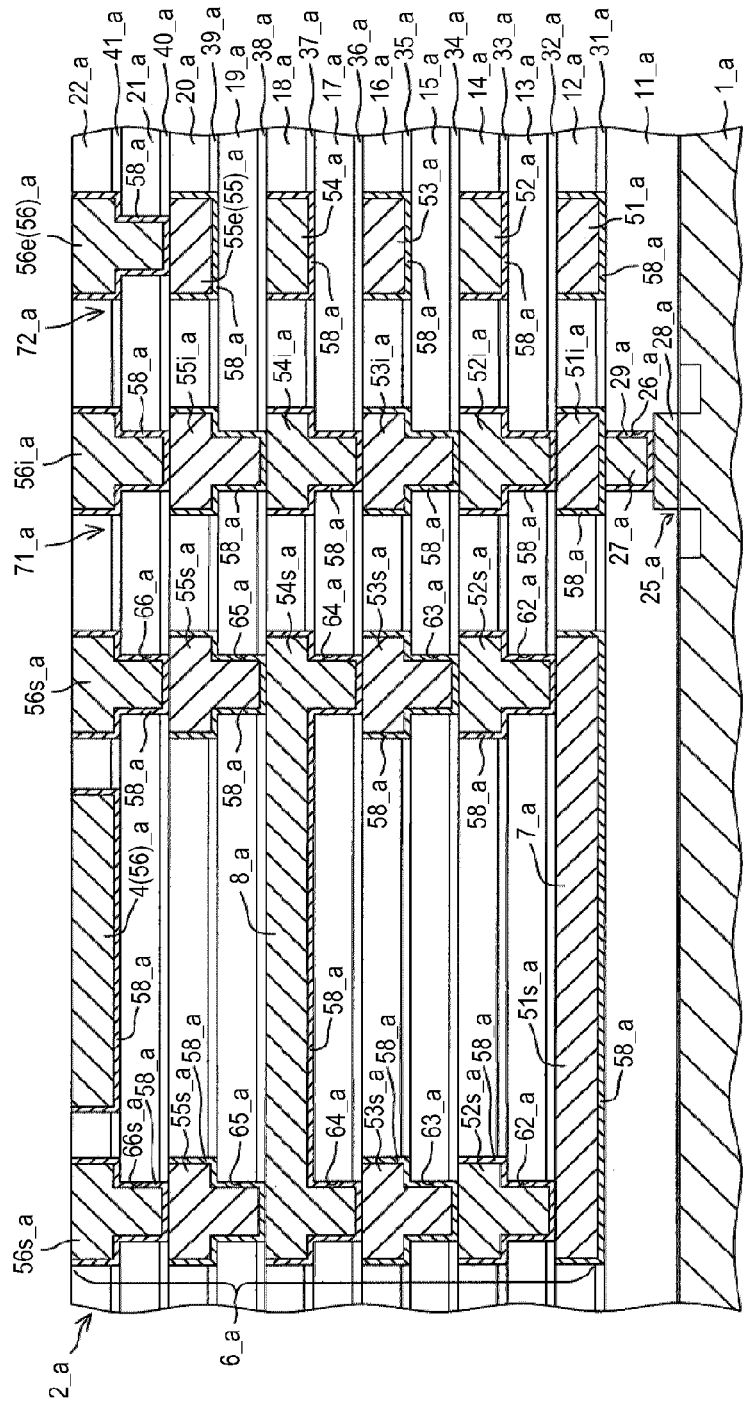
FIG. 10B is a sectional view showing a subsequent process of FIG. 10A.

Thereafter, the same dual-damascene process is repeatedly performed to thereby stack the interlayer insulating films 19_a~21_a (the second interlayer insulating films) on the seal film 8_a and form the fuse film 4_a thereon, as shown in FIG. 10B. Further, at the same time, the cylindrical copper sealing member 6_a is formed to surround the fuse film 4_a and be coupled to the seal film 8_a through the interlayer insulating films 19_a~21_a when viewed from a side cross-sectional view.

Figure 10C:
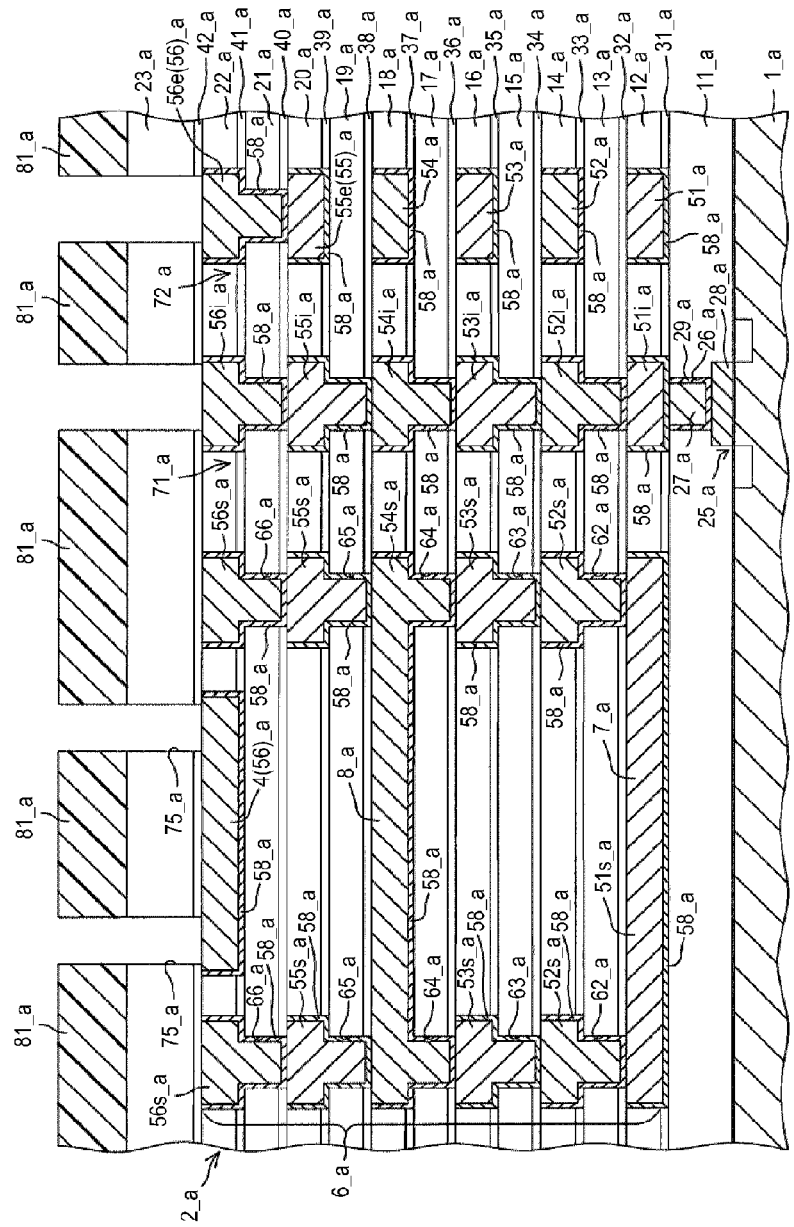
FIG. 10C is a sectional view showing a subsequent process of FIG. 10B.

Next, as shown in FIG. 10C, the interlayer insulating film 23_a is formed. The interlayer insulating film 23_a is made of, for example, $SiO_2$, and may be formed through a plasma CVD method. Then, a resist 81_a having a pattern with an opening corresponding to a contact hole 75_a for the plug 9_a is formed. The interlayer insulating film 23_a is etched through etching using the resist 81_a as a mask, and accordingly, the contact hole 75_a that penetrates the interlayer insulating film 23_a is formed. Etching for forming the contact hole 75_a is stopped at the wiring layer 56_a (including the fuse film 4_a). After the formation of the contact hole 75, the resist 81_a is removed.

Figure 10D:
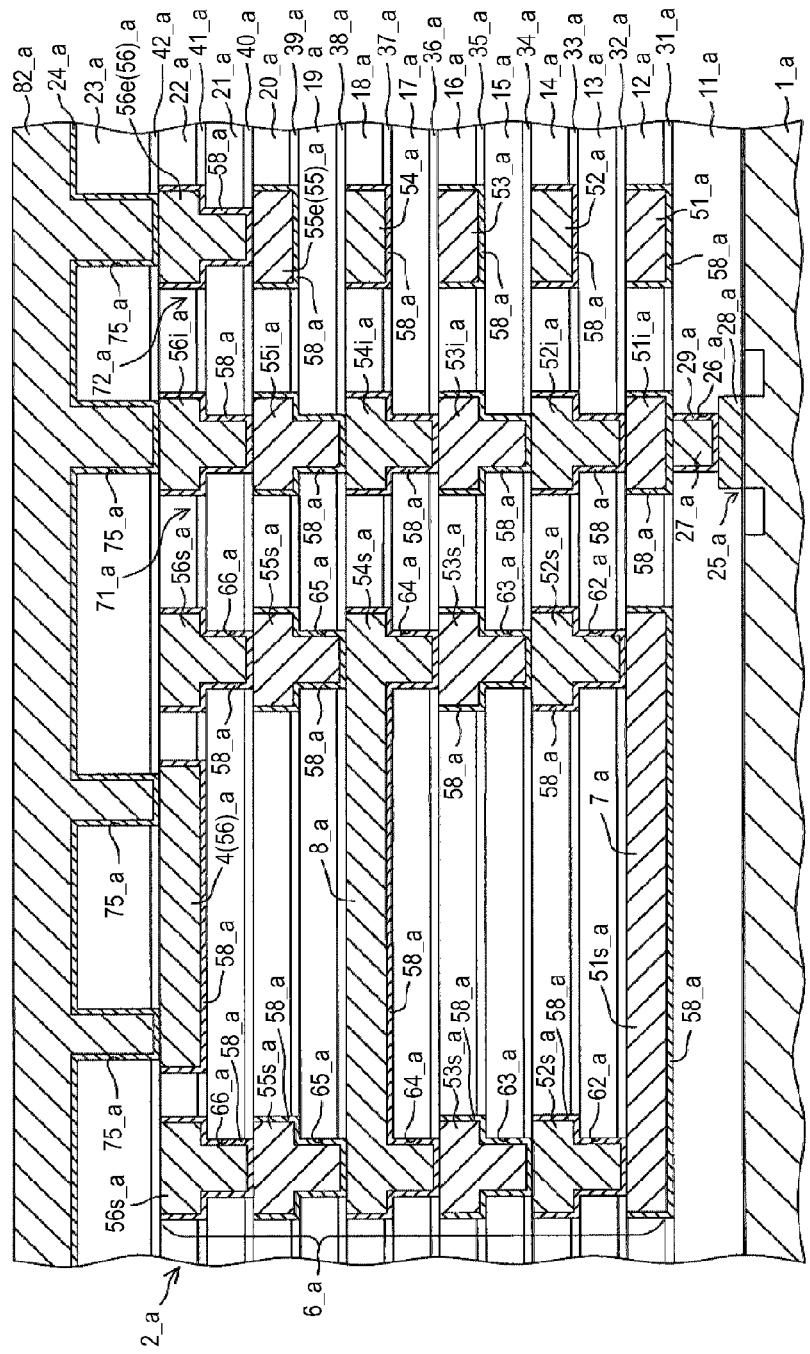
FIG. 10D is a sectional view showing a subsequent process of FIG. 10C.

Next, as shown in FIG. 10D, the barrier metal layer 24_a and an electrode film 82 are formed. The barrier metal layer 24_a is formed to cover the surface (the upper surface) of the interlayer insulating film 23_a, the inner side wall of the contact hole 75_a, and the surface of the copper wiring layer 56_a exposed from the lower surface of the contact hole 75_a. After the formation of the barrier metal layer 24_a, an electrode film 82_a is formed. The electrode film 82_a is made of metallic material to be used for constituting the plug 9_a and is deposited on the entire surface to fill the contact hole 75_a. The barrier metal layer 24_a is configured as, for example, a stacked film formed by sequentially stacking a Ta film, a TaN film, a Ti film, and a TiN film, from the lower side, and may be formed by sequentially depositing the constituent films through a sputtering method. The electrode film 82_a is made of, for example, tungsten (W) and may be formed through a CVD method.

Figure 10E:
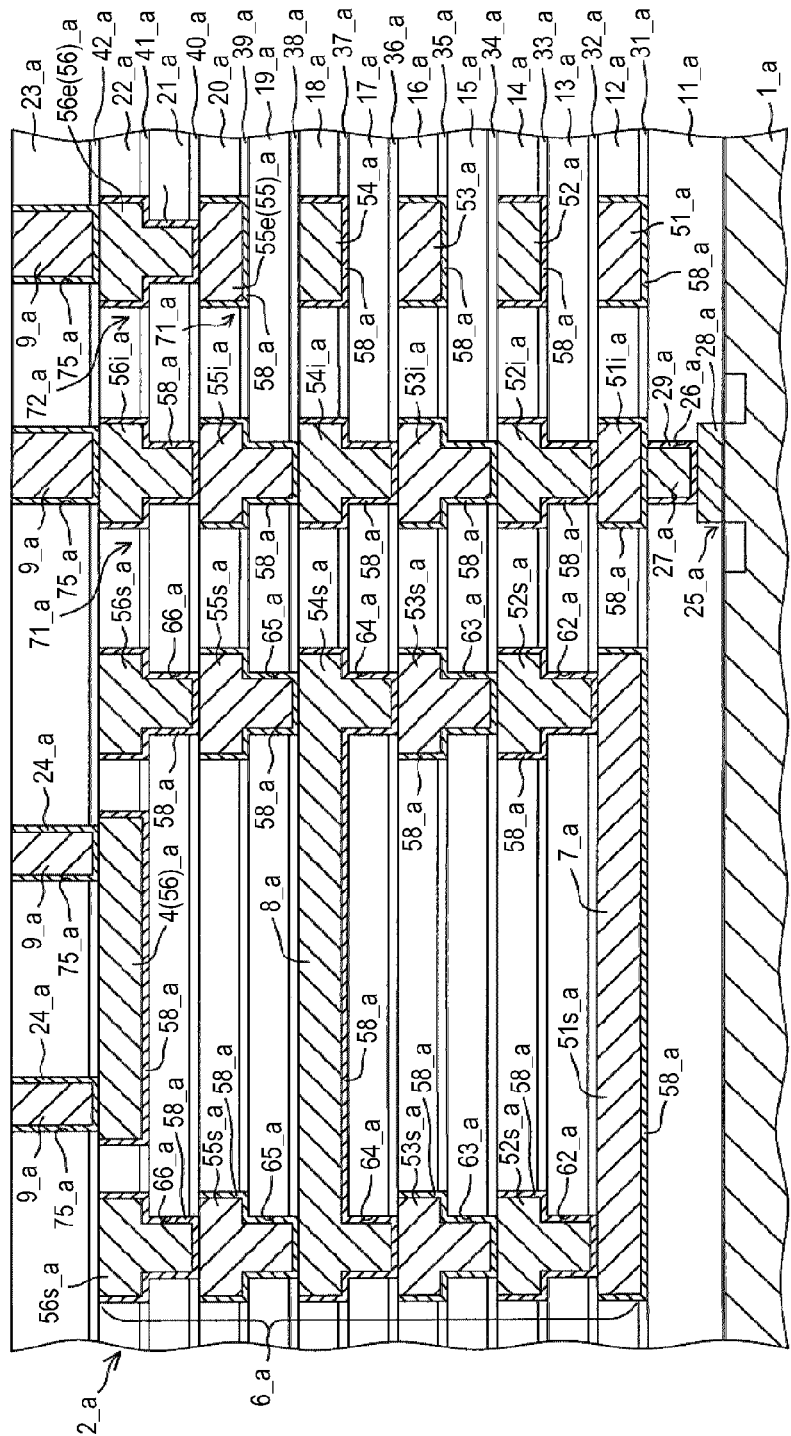
FIG. 10E is a sectional view showing a subsequent process of FIG. 10D.

Next, as shown in FIG. 10E, the surface is planarized by, for example, a CMP method, and the electrode film 82_a outside the contact hole 75_a is removed. In this manner, the plug 9_a is disposed within each contact hole 75_a. Thereafter, the uppermost wiring 5_a is formed to have a certain pattern as shown in FIG. 8, and the passivation film 3_a covering the uppermost wiring 5_a is formed. And, the passivation film 3_a is selectively etched to form the opening 46_a for the pad and the concave portion 49_a as a fuse processing window. In this manner, the semiconductor device having the structure shown in FIG. 8 is obtained.

One embodiment of the present disclosure has been described so far, but another embodiment may be implemented. For example, in the foregoing embodiment, the case in which the two sheets of seal films 7_a and 8_a are formed between the fuse film 4_a and the semiconductor substrate 1_a is described as an example, but the lower seal film 7_a may be omitted or the upper seal film 8_a may be omitted to dispose a sheet of seal film between the semiconductor substrate 1_a and the fuse film 4_a. In case of omitting the lower seal film 7_a, a portion lower than the seal film 8_a may be omitted in the copper sealing member 6_a. This means that it does not necessarily require a lot of wiring layers between the fuse film 4_a and the semiconductor substrate 1_a. Thus, even in a semiconductor device having a multilayer wiring structure with less number of layers, it is possible to provide the copper fuse while avoiding the deterioration of the characteristics of the element formed on the semiconductor substrate. In addition, in case of omitting the lower seal film 7_a, a wiring for forming a circuit at a lower region of the seal film 7_a may be provided. Of course, besides the seal films 7_a and 8_a, an extra seal film may also be added, and three or more sheets of seal films may be disposed between the fuse film 4_a and the semiconductor substrate 1_a.

Further, in the foregoing embodiment, the case in which the element 25 is formed outside the copper sealing member 6_a when viewed from the plane is taken as an example, but the element 25 may be formed inside the copper sealing member 6_a. The seal films 7_a and 8_a interposed between the fuse film 4_a and the semiconductor substrate 1_a can restrain or prevent the spread of copper atoms toward the element formed inside the copper sealing member 6_a. In this manner, by disposing the element also inside the copper sealing member 6_a, the degree of element integration can be increased.

Moreover, in the foregoing embodiments, the case in which the sealing member 6 is formed to have the square container-like shape is taken as an example, but the sealing member 6 may have a container-like shape with a lower surface having a polygonal shape other than a square shape or may have any other container-like shapes such as a cylindrical shape, an oval cylindrical shape, or the like. Various design modifications may be made within the scope of the claim coverage.

Moreover, in the foregoing embodiments, the case in which the sealing member 6 is formed to have the square container-like shape is taken as an example, but the sealing member 6 may have a container-like shape with a lower surface having a polygonal shape other than a square shape or may have any other container-like shapes such as a cylindrical shape, an oval cylindrical shape, or the like.

Various design modifications may be made within the scope of the claim coverage.

While certain embodiments have been described, these embodiments have been presented by way of example only, and are not intended to limit the scope of the disclosures. Indeed, the subject matter described herein may be embodied in a variety of other forms or in any combination; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A semiconductor device, comprising:
a semiconductor substrate;
a copper fuse;
a plurality of insulating layers, each of the plurality of insulating layers having a first via hole and a second via hole, the first via hole and the second via hole being filled with a first conductive material and a second con- ductive material, respectively, wherein one of the plurality of insulating layers is formed on an upper layer of the copper fuse;

a wiring layer formed on each of the plurality of insulating layers, the wiring layer having a first contact portion and a second contact portion that are connected to the first conductive material and the second conductive material, respectively, the wiring layer being made of a metallic layer that includes a metallic material other than copper;

first and second sealing layers disposed between the semiconductor substrate and the copper fuse, the first and second sealing layers being made of copper, wherein at least one of the plurality of insulating layers is provided between the first and second sealing layers so that the first and second sealing layers are apart from each other; and a copper sealing member coupled to the first and second sealing layers and formed to have a container-like shape that surrounds the copper fuse.

2. The semiconductor device of claim 1, further comprising an external connection layer formed in a same layer as the wiring layer, the external connection layer being made of the same material as the wiring layer.

3. The semiconductor device of claim 1, further comprising a plurality of copper wiring layers, wherein the copper fuse is formed in a same layer as an uppermost copper wiring layer.

4. The semiconductor device of claim 1, wherein the first conductive material and the second conductive material are made of tungsten.

5. The semiconductor device of claim 1, wherein the wiring layer is made of a conductive material including Aluminum (Al) as a main ingredient.

\* \* \* \* \*